United States Patent
Hemink et al.

(10) Patent No.: US 8,526,233 B2
(45) Date of Patent: Sep. 3, 2013

(54) RAMPING PASS VOLTAGE TO ENHANCE CHANNEL BOOST IN MEMORY DEVICE, WITH OPTIONAL TEMPERATURE COMPENSATION

(75) Inventors: Gerrit Jan Hemink, Yokohama (JP); Shih-Chung Lee, Yokohama (JP); Anubhav Khandelwal, Mountain View, CA (US); Henry Chin, Fremont, CA (US); Guirong Liang, Santa Clara, CA (US); Dana Lee, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 109 days.

(21) Appl. No.: 13/113,786

(22) Filed: May 23, 2011

(65) Prior Publication Data

US 2012/0300550 A1 Nov. 29, 2012

(51) Int. Cl.
*G11C 11/34* (2006.01)
(52) U.S. Cl.
USPC .................................................. 365/185.17
(58) Field of Classification Search
USPC .................................................. 365/185.17
See application file for complete search history.

(56) References Cited

U.S. PATENT DOCUMENTS

| | | | |
|---|---|---|---|
| 5,172,338 A | 12/1992 | Mehrotra et al. | |
| 6,243,295 B1 | 6/2001 | Satoh | |
| 6,560,152 B1 | 5/2003 | Cernea | |
| 6,801,454 B2 | 10/2004 | Wang et al. | |
| 6,944,057 B1 | 9/2005 | Runnion et al. | |
| 7,184,311 B2 | 2/2007 | Frulio et al. | |
| 7,379,338 B2 | 5/2008 | Frulio et al. | |
| 7,400,533 B2 | 7/2008 | Roohparvar | |
| 7,436,709 B2 | 10/2008 | Higashitani | |
| 7,447,086 B2 | 11/2008 | Wan et al. | |
| 7,583,535 B2 | 9/2009 | Sekar et al. | |
| 7,583,539 B2 | 9/2009 | Sekar et al. | |
| 7,596,026 B2 | 9/2009 | Kwon et al. | |
| 7,606,099 B2 | 10/2009 | Chung | |
| 7,619,933 B2 | 11/2009 | Sarin | |
| 7,656,703 B2 | 2/2010 | Dong et al. | |

(Continued)

FOREIGN PATENT DOCUMENTS

WO WO 2008/002832 A2 1/2008

OTHER PUBLICATIONS

U.S. Appl. No. 12/785,636, filed May 24, 2010.
U.S. Appl. No. 12/947,693, filed Nov. 16, 2010.

(Continued)

*Primary Examiner* — Anthan Tran
(74) *Attorney, Agent, or Firm* — Vierra Magen Marcus LLP

(57) ABSTRACT

In a non-volatile storage system, one or more substrate channel regions for an unselected NAND string are boosted during programming to inhibit program disturb. A voltage applied to one or more unselected word lines associated with at least a first channel region is increased during a program pulse time period in which a program pulse is applied to a selected word line. The increase can be gradual, in the form of a ramp, or step-wise. The boosting level of the first channel region can be maintained. The increase in the voltage applied to the one or more unselected word lines can vary with temperature as well. Before the program pulse time period, the voltage applied to the one or more unselected word lines can be ramped up at a faster rate for a second, adjacent channel region than for the first channel region, to help isolate the channel regions.

22 Claims, 19 Drawing Sheets

(56) References Cited

U.S. PATENT DOCUMENTS

| | | |
|---|---|---|
| 7,719,888 B2 | 5/2010 | Han |
| 7,755,946 B2 | 7/2010 | Dunga et al. |
| 2006/0133143 A1 | 6/2006 | Hosono |
| 2007/0258276 A1 | 11/2007 | Higashitani |
| 2008/0089130 A1 | 4/2008 | Park |
| 2008/0094908 A1 | 4/2008 | Mokhlesi et al. |
| 2008/0159002 A1* | 7/2008 | Dong et al. ............. 365/185.25 |
| 2009/0067246 A1 | 3/2009 | Walker |
| 2009/0086542 A1* | 4/2009 | Lee et al. ................ 365/185.17 |
| 2009/0097319 A1* | 4/2009 | Sekar et al. ............. 365/185.17 |
| 2009/0141557 A1* | 6/2009 | Fujiu ....................... 365/185.19 |
| 2010/0097863 A1 | 4/2010 | Kim et al. |
| 2010/0110793 A1 | 5/2010 | Kim et al. |
| 2010/0128534 A1 | 5/2010 | Moschiano et al. |
| 2010/0177550 A1 | 7/2010 | Hase et al. |
| 2010/0214846 A1 | 8/2010 | Kim et al. |

OTHER PUBLICATIONS

International Search Report & The Written Opinion of the International Searching Authority dated Aug. 17, 2012, International Application No. PCT/US2012/038992.

* cited by examiner

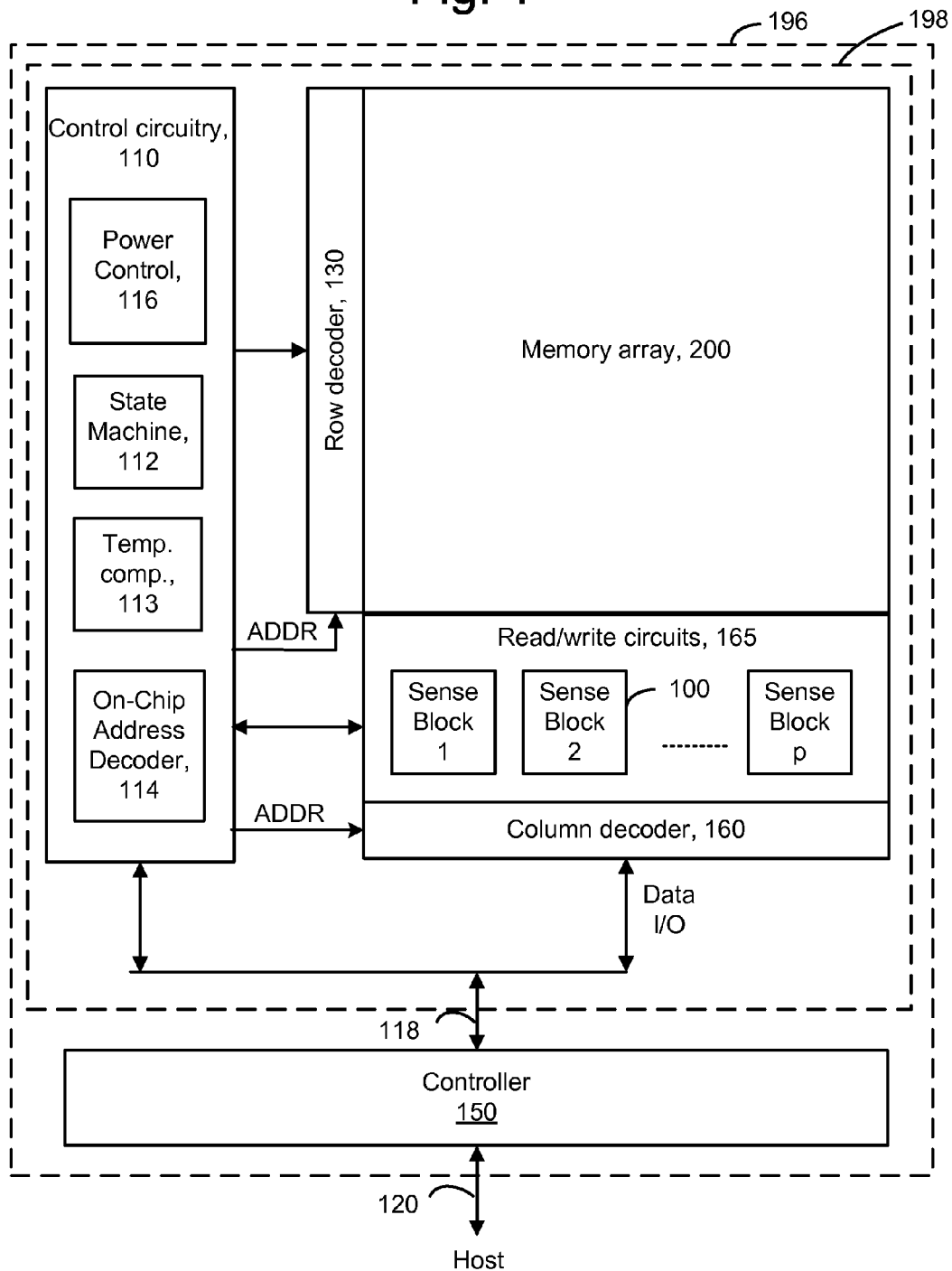

First programming pass

Second programming pass

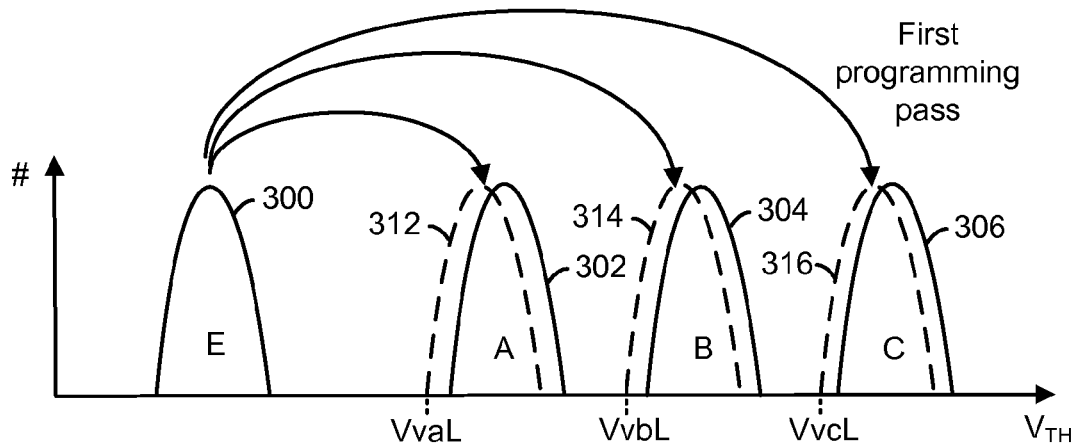
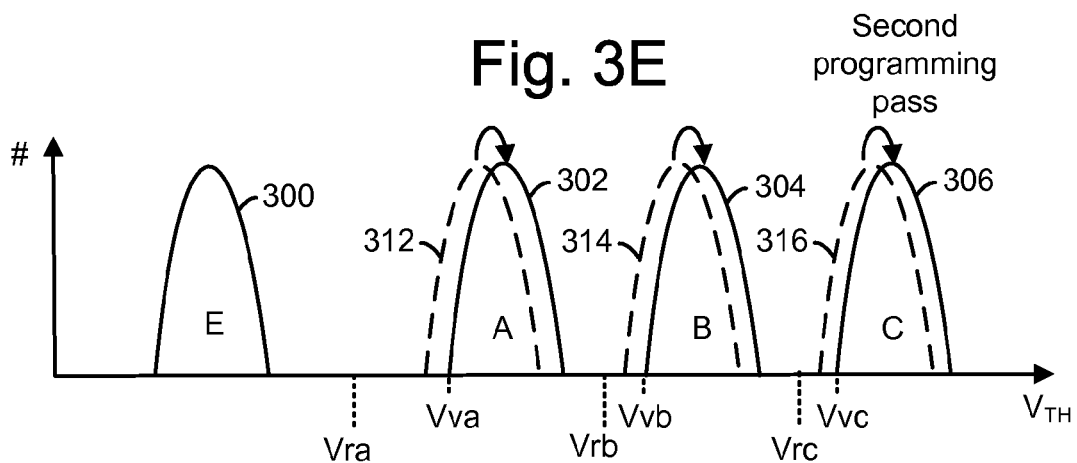

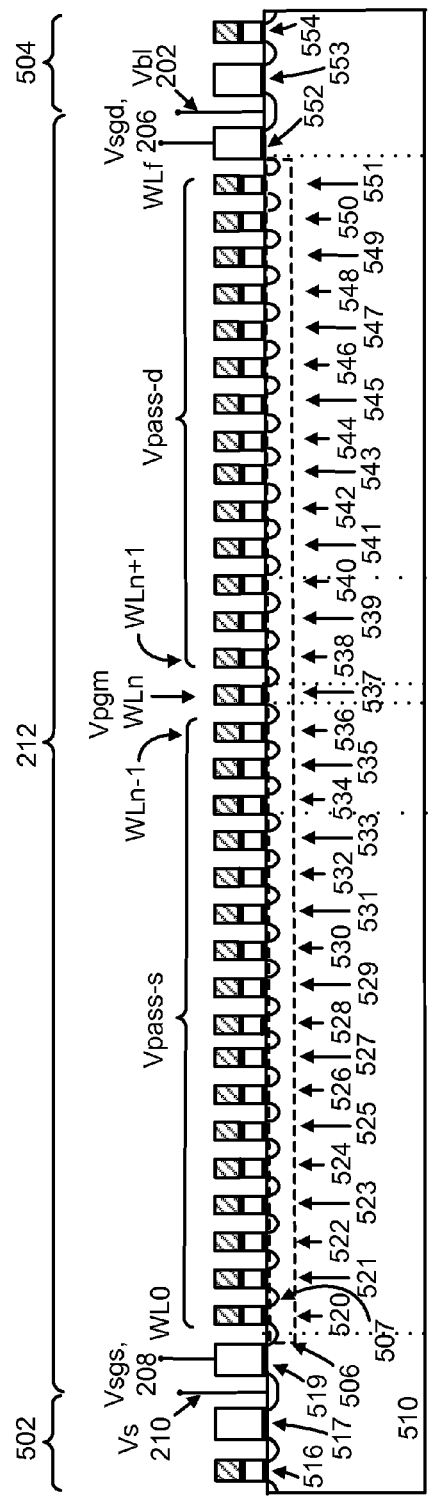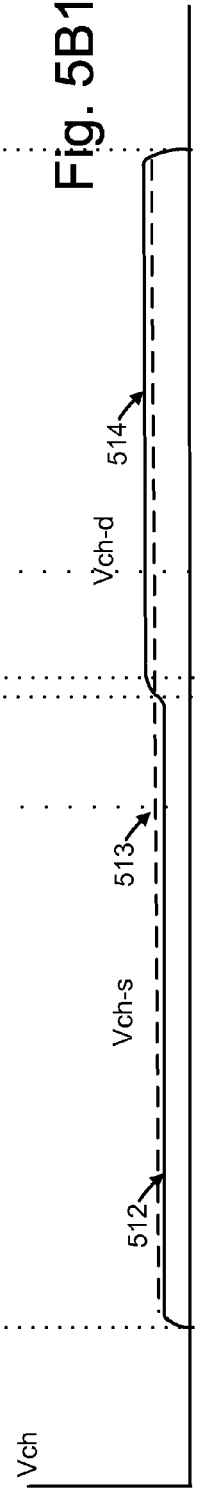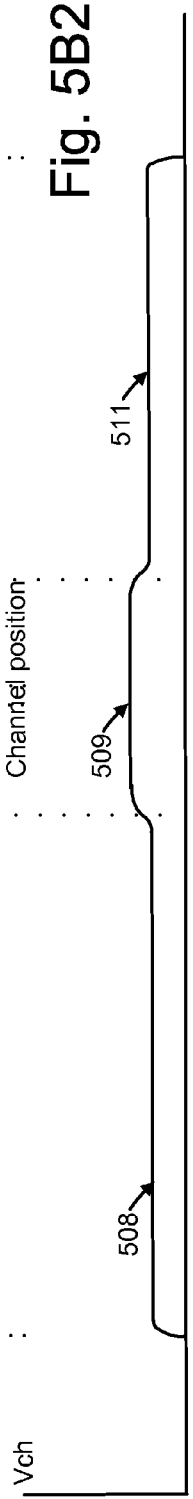

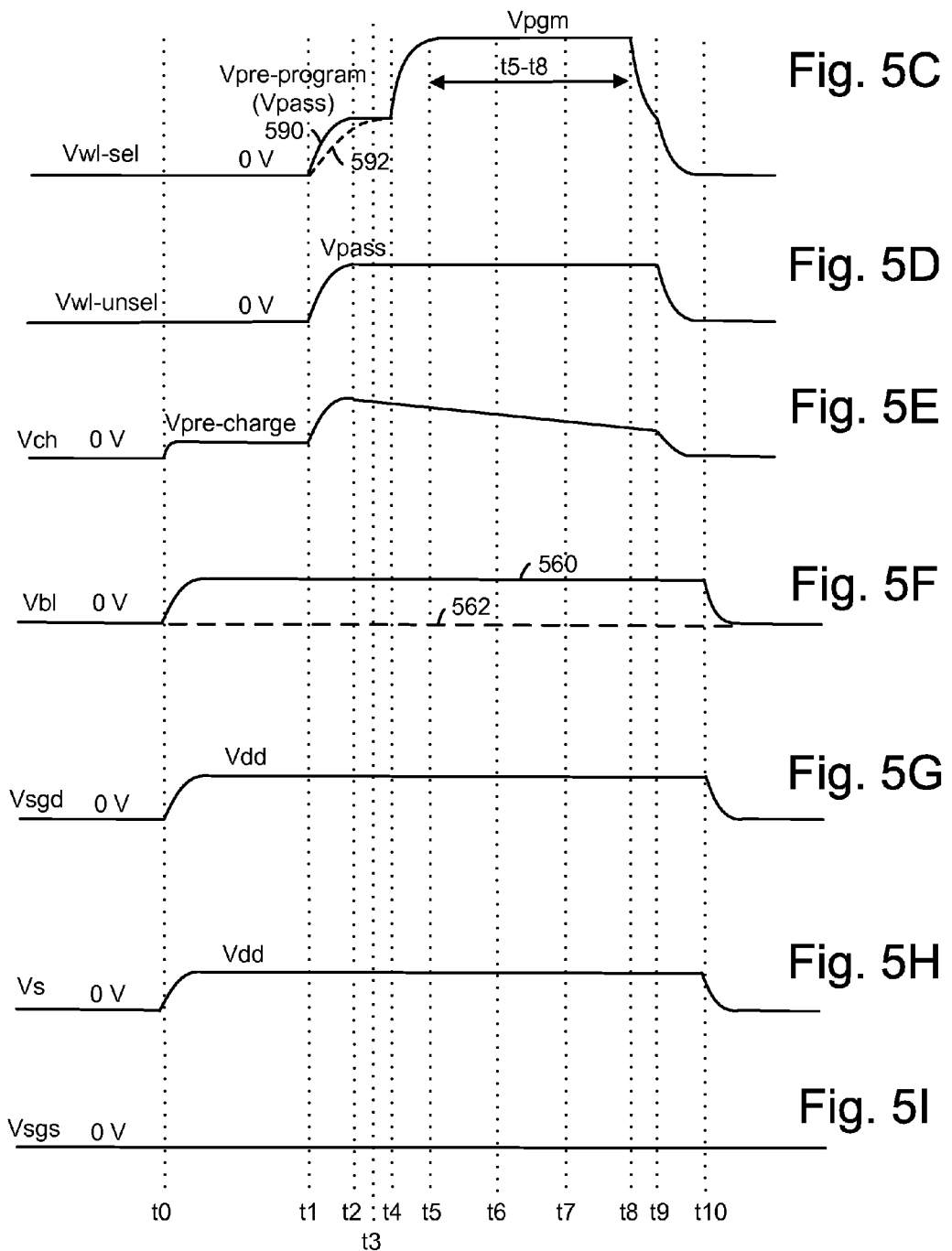

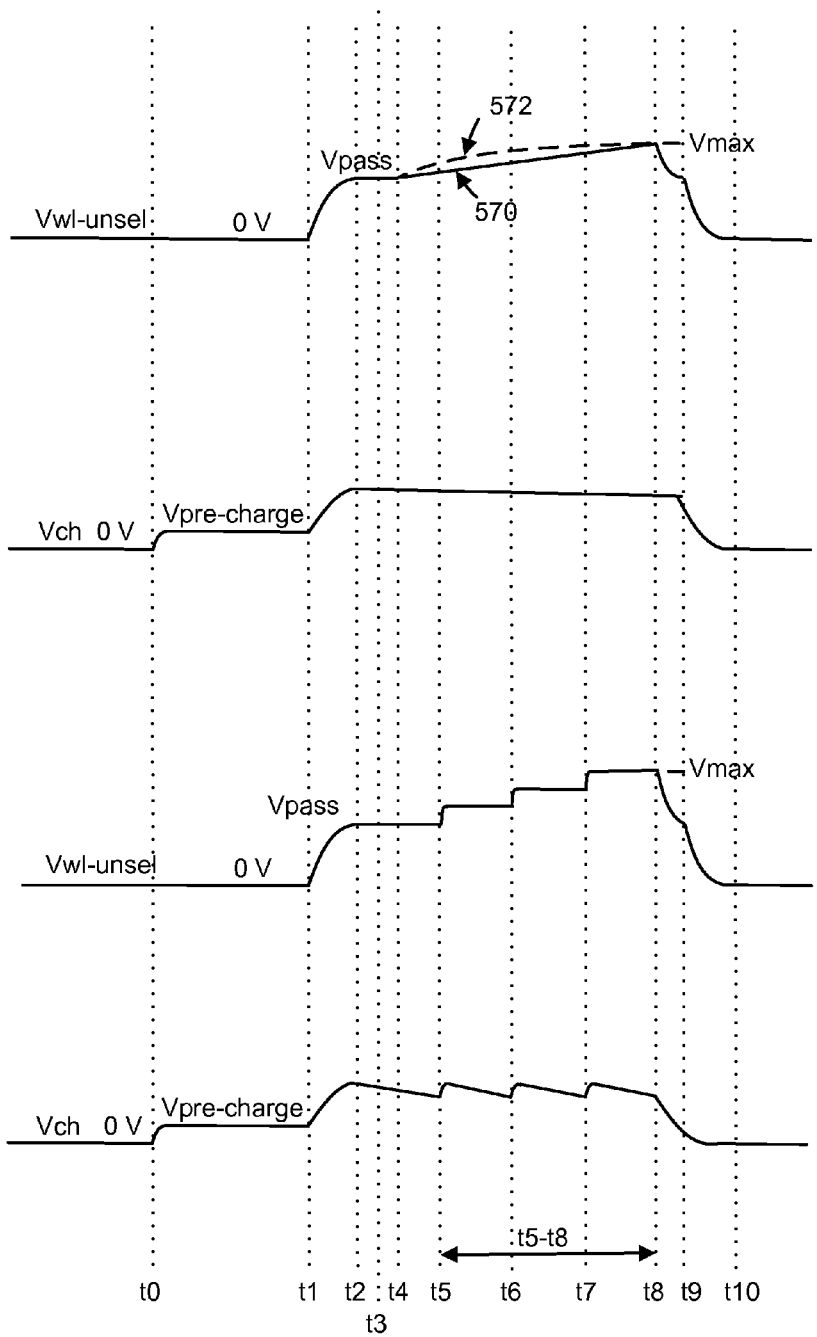

Fig. 7B

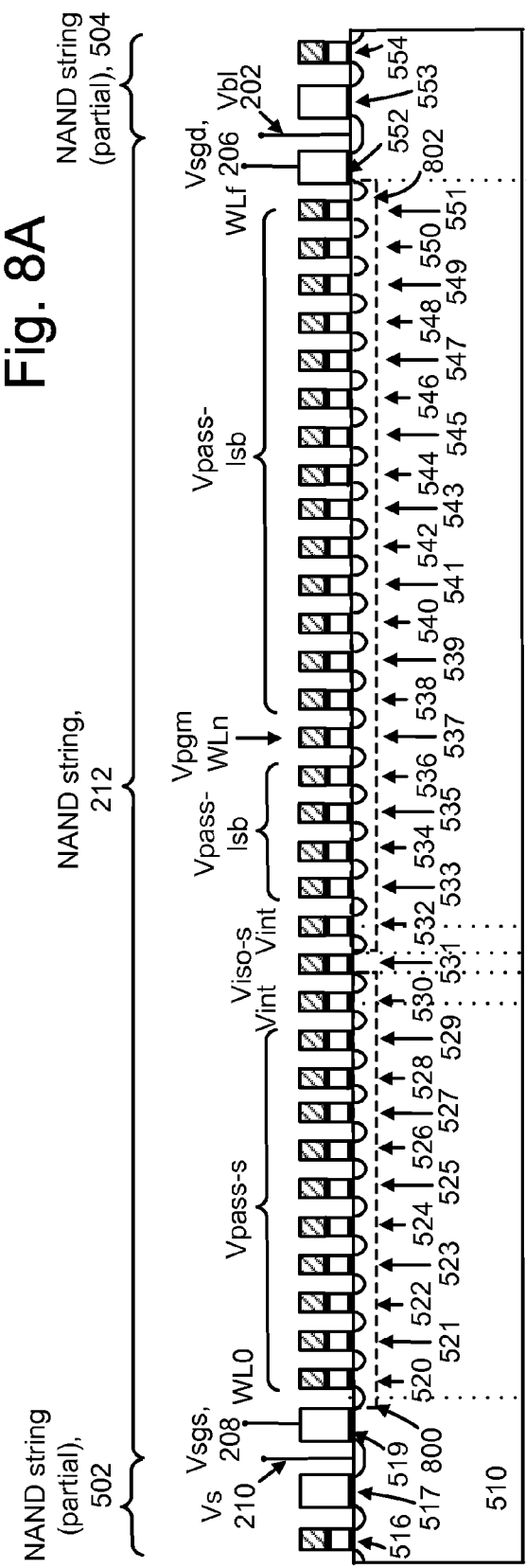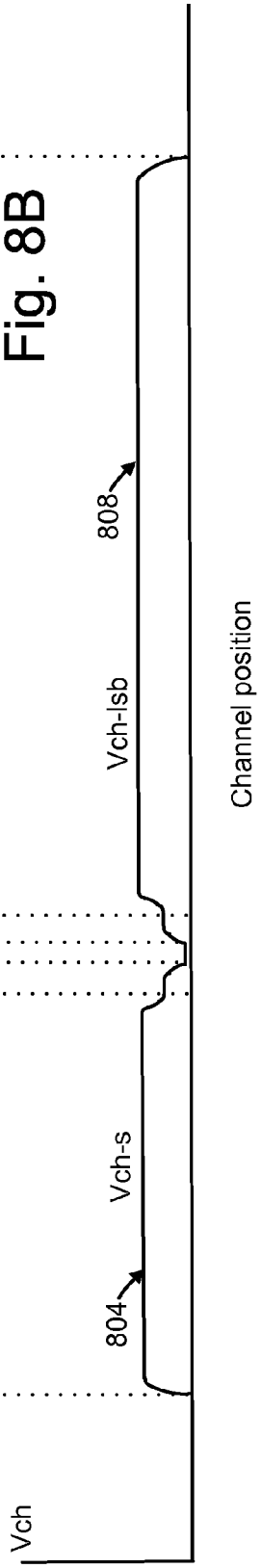
Fig. 8A
Fig. 8B

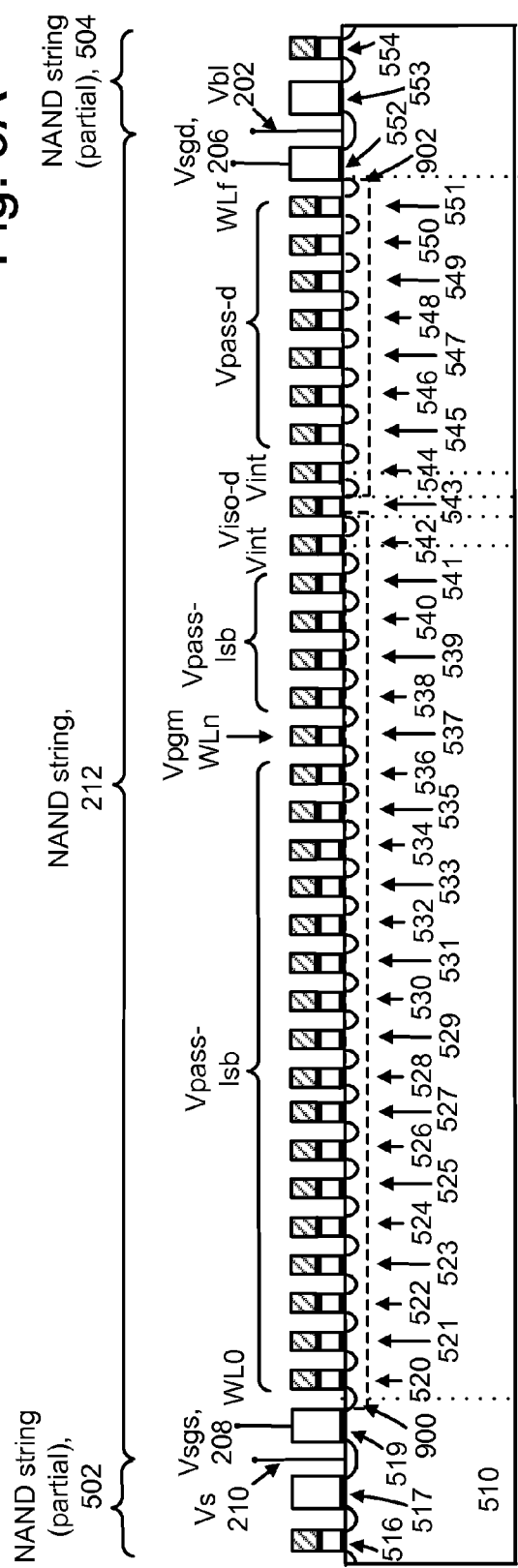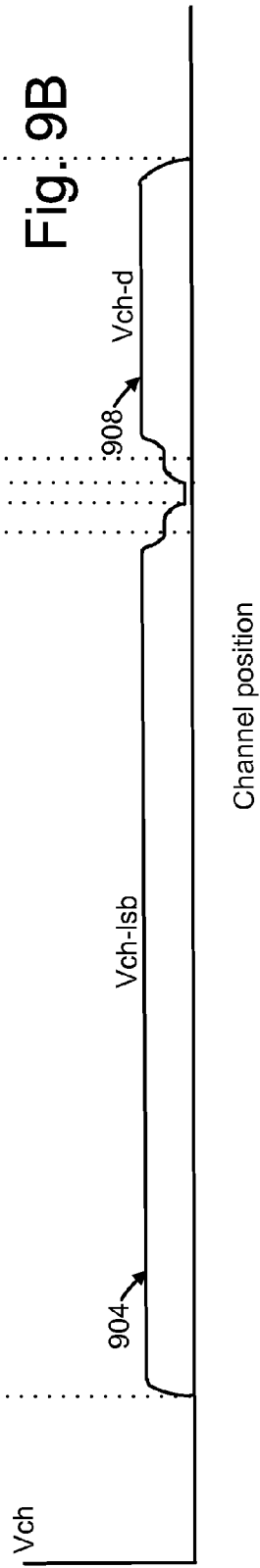

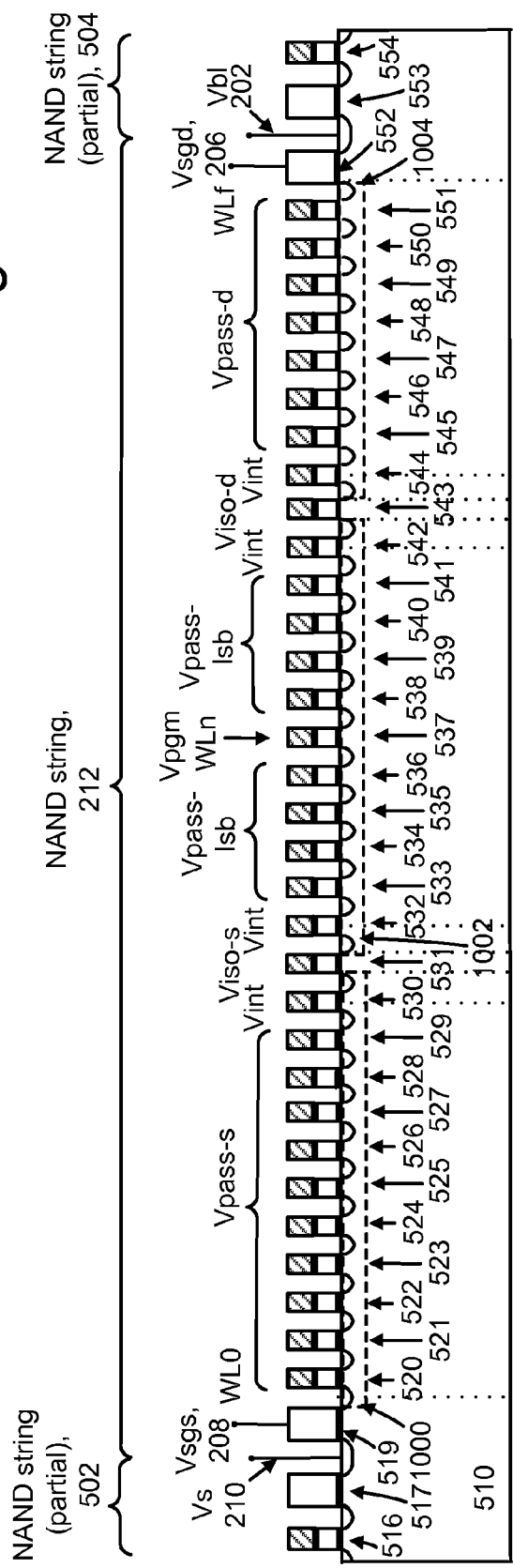
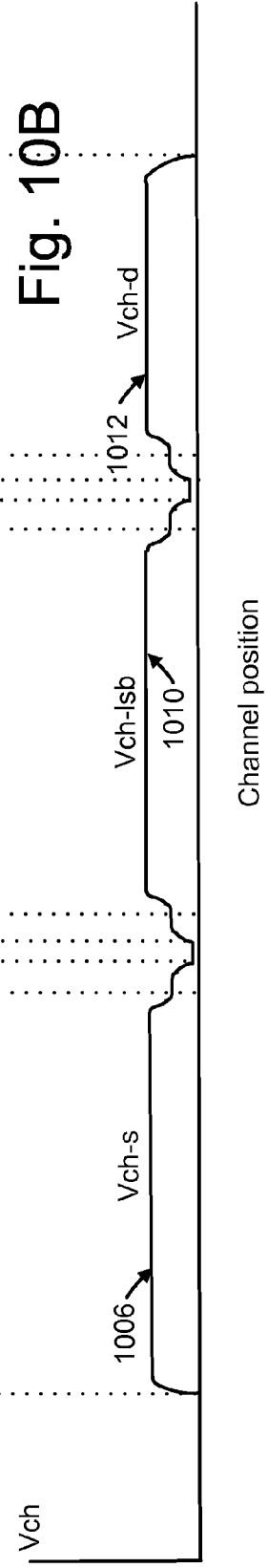

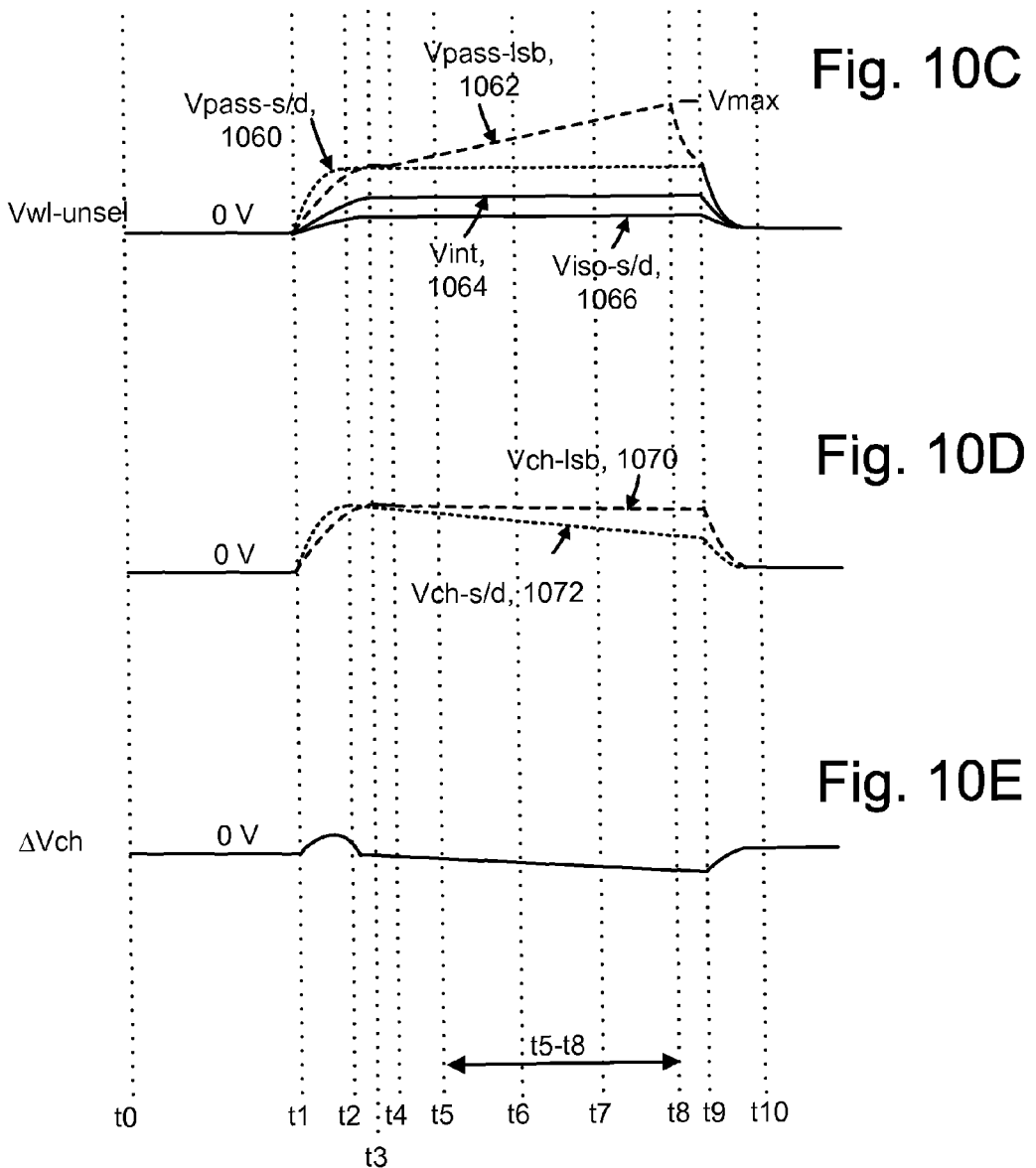

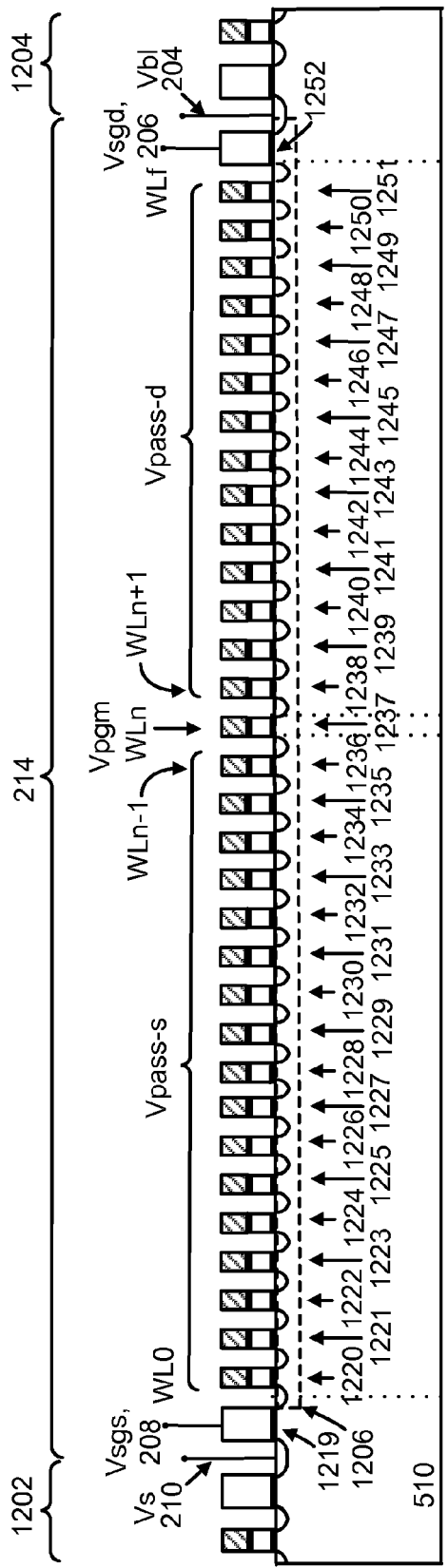

RAMPING PASS VOLTAGE TO ENHANCE CHANNEL BOOST IN MEMORY DEVICE, WITH OPTIONAL TEMPERATURE COMPENSATION

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the storage element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size or increment, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line of a NAND string which is selected for programming is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, for a NAND string which is not selected for programming, the associated storage elements are subject to program disturb when Vpgm is applied.

BRIEF DESCRIPTION OF THE DRAWINGS

In the drawings, like-numbered elements correspond to one another.

FIG. 1 is a block diagram of a non-volatile memory system using single row/column decoders and read/write circuits.

FIG. 3D illustrates a first pass of another two-pass programming technique.

FIG. 3E illustrates a second pass of the two-pass programming technique of FIG. 3D.

FIG. 5A depicts a cross-sectional view of the unselected NAND string 212 of FIG. 2A showing a first channel boosting technique.

FIG. 5B1 is a graph showing channel boosting levels in the substrate of the unselected NAND string of FIG. 5A.

FIG. 5B2 is a graph showing channel boosting levels in the substrate of the unselected NAND string of FIG. 5A, in another embodiment.

FIG. 5C depicts a voltage applied to a selected word line during a program portion of a program-verify iteration.

FIG. 5D depicts a fixed voltage applied to unselected word lines during a program portion of a program-verify iteration, consistent with the channel boosting technique of FIG. 5A.

FIG. 5E depicts a channel boosting level in the substrate of the NAND string for the channel boosting technique of FIG. 5A, when the unselected word line voltage of FIG. 5D is used.

FIG. 5F depicts a voltage applied to a bit line 202 of the unselected NAND string of FIG. 5A during a program portion of a program-verify iteration.

FIG. 5G depicts a voltage applied to a line 206 in communication with a drain-side select gate of the unselected NAND string of FIG. 5A during a program portion of a program-verify iteration.

FIG. 5H depicts a voltage applied to a source line 210 of the unselected NAND string of FIG. 5A during a program portion of a program-verify iteration.

FIG. 5I depicts a voltage applied to a line 208 in communication with a source-side select gate of the unselected NAND string of FIG. 5A during a program portion of a program-verify iteration.

FIG. 5J depicts a voltage applied to an unselected word line during a program portion of a program-verify iteration, where the voltage is increased in a linear or non-linear ramp, such as for the first channel boosting technique of FIG. 5A.

FIG. 5K depicts a channel boosting level in the substrate of the NAND string of FIG. 5A, e.g., based on the unselected word line voltages of FIG. 5J.

FIG. 5L depicts a step-wise increasing voltage applied to an unselected word line during a program portion of a program-verify iteration, as an alternative to the ramped voltage of FIG. 5J.

FIG. 5M depicts a channel boosting level in the substrate of the NAND string of FIG. 5A, e.g., based on the unselected word line voltage of FIG. 5L.

FIG. 7B depicts a step-wise increasing voltage applied to an unselected word line during a program portion of a program-verify iteration, as a function of temperature, as an alternative to the ramped voltage of FIG. 7A.

FIG. 8A depicts a cross-sectional view of the unselected NAND string 212 of FIG. 2A showing a second channel boosting technique.

FIG. 8B is a graph showing channel boosting levels in the substrate of the unselected NAND string of FIG. 8A.

FIG. 9A depicts a cross-sectional view of the unselected NAND string 212 of FIG. 2A showing a third channel boosting technique.

FIG. 9B is a graph showing channel boosting levels in the substrate of the unselected NAND string of FIG. 9A.

FIG. 10A depicts a cross-sectional view of the unselected NAND string 212 of FIG. 2A showing a fourth channel boosting technique.

FIG. 10B is a graph showing channel boosting levels in the substrate of the unselected NAND string of FIG. 10A.

FIG. 10C depicts voltages applied to unselected word lines during a program portion of a program-verify iteration, for the channel boosting techniques of FIGS. 8A, 9A or 10A.

FIG. 10D depicts channel boosting levels in the substrate of the NAND string of FIGS. 8A, 9A or 10A e.g., based on the unselected word line voltages of FIG. 10C.

FIG. 10E depicts a difference in the channel boosting levels of FIG. 10D.

FIG. 12A depicts a cross-sectional view of the selected NAND string 214 of FIG. 2A.

FIG. 12B is a graph showing no channel boosting in the substrate of the selected NAND string of FIG. 12A.

DETAILED DESCRIPTION

Figure 2A:
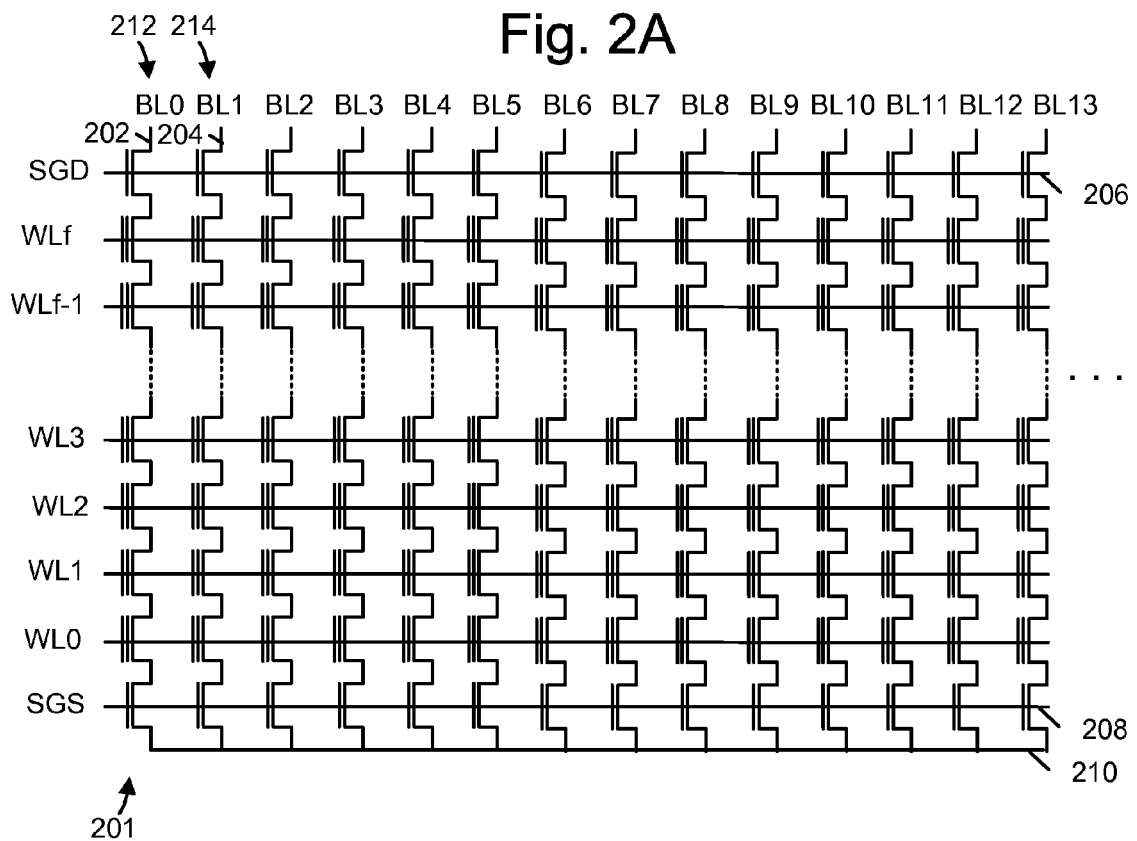
FIG. 2A depicts an example block in a memory array, such as the memory array 200 of FIG. 1.

A method and non-volatile storage system are provided in which programming is optimized to reduce program disturb.

During a programming operation, unselected storage elements which have previously completed programming to a target data state are inhibited or locked out from further programming by boosting associated substrate channel regions. Channel boosting is used to reduce the occurrence of program disturb of inhibited storage elements in which their threshold voltages are raised to a next higher data state, other data states, or to a level at which the storage element cannot be accurately read, for example, in between two adjacent data states. The occurrence of Vpass disturb is also reduced. Program disturb generally refers to disturbs which occur on inhibited storage elements that are associated with other storage elements that are still being programmed, i.e. storage elements that are controlled by the same word line and are subjected to a program voltage. Vpass disturb generally refers to disturbs which are caused specifically by pass voltages. A channel boosting level can deteriorate over time, more specifically, the channel boosting level can deteriorate during the application of a program voltage or program pulse due to leakage currents, later referred to as channel leakage, and thus result in worsening program disturb. Moreover, the ambient temperature of the memory device can affect the amount of program disturb as the channel leakage can be temperature dependent.

It has been determined that channel boosting can be improved by providing a controlled increase of a voltage which is applied to one or more unselected word lines during a program pulse time period in which a program pulse is applied to a selected word line. The increase can be gradual, in the form of a ramp, or step-wise, in the form of a staircase, for instance. This controlled increase helps maintain the boosting level of the first channel region by offsetting the effects of channel leakage. Moreover, the rate of increase in the voltage can vary with temperature to further optimize the channel boosting level. Channel boosting levels can be improved at high temperatures without increasing Vpass disturb at low temperatures.

In an additional aspect, before the program pulse time period in which a program pulse is applied, the voltage applied to the one or more unselected word lines can be ramped up at different rates for different unselected word lines to help isolate different channel regions and maintain the channel boosting level in at least one of the channel regions.

FIG. 1 is a block diagram of a non-volatile memory system using single row/column decoders and read/write circuits. The diagram illustrates a memory device 196 having read/write circuits for reading and programming a page of storage elements in parallel, according to one embodiment. Memory device 196 may include one or more memory die 198.

Memory die 198 includes a two-dimensional array of storage elements 200, control circuitry 110, and read/write circuits 165. In some embodiments, the array of storage elements can be three dimensional. The memory array 200 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 196 (e.g., a removable storage card) as the one or more memory die 198. Commands and Data are transferred between the host and controller 150 via lines 120 and between the controller and the one or more memory die 198 via lines 118.

The control circuitry 110 cooperates with the read/write circuits 165 to perform memory operations on the memory array 200. The control circuitry 110 includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. During programming, the power supply module can supply different constant and varying voltages to the word lines and select gates. For example, voltages for a selected word line (Vwl-sel) can include Vpre-program, Vpass and Vpgm. Voltages for the select gates can include Vsgd and Vsgs. Voltages for an unselected word line (Vwl-unsel) can include Vpass, Vpass-s/d, Vpass-lsb, Vint and Viso-s/d. The voltages applied to the word lines can be independent and have their own step-up rate and/or ramp rate. Different step-up rates or ramp rates can be achieved using different RC time constants. With a lower RC time constant, the step up or ramp is faster, and with a higher RC time constant, the step up or ramp is slower.

A temperature compensation block 113 can provide a temperature-dependent reference signal for use by the control circuitry, such as in setting voltages of unselected word lines as described further below. Various techniques are known for providing a temperature-dependent reference signal for a memory device. In one possible approach, a band gap circuit is used. For example, U.S. Pat. No. 6,801,454, titled "Voltage Generation Circuitry Having Temperature Compensation," incorporated herein by reference, describes a voltage generation circuit which outputs read voltages to a non-volatile memory based on a temperature coefficient. The circuit uses a band gap current which includes a temperature-independent portion and a temperature-dependent portion which increases as temperature increases. U.S. Pat. No. 6,560,152, titled "Non-Volatile Memory With Temperature-Compensated Data Read," incorporated herein by reference, uses a bias generator circuit which biases a voltage which is applied to a source or drain of a data storage element. U.S. Pat. No. 5,172,338, titled "Multi-State EEPROM Read and Write Circuits and Techniques", incorporated herein by reference, describes a temperature-compensation technique which uses reference storage cells that are formed in the same manner, and on the same integrated circuit chip, as data storage cells. The reference storage cells provide reference levels against which measured currents or voltages of the selected cells are compared. Temperature compensation is provided since the reference levels are affected by temperature in the same manner as the values read from the data storage cells. Any of these techniques, as well as any other known techniques, can be used to provide a temperature-dependent reference signals.

In some implementations, some of the components of FIG. 1 can be combined. In various designs, one or more of the components (alone or in combination), other than storage element array 200, can be thought of as a managing or control circuit. For example, one or more managing or control circuits may include any one of, or a combination of, control circuitry 110, state machine 112, decoders 114/160, power control 116, sense blocks 100, read/write circuits 165, controller 150, etc.

In another embodiment, a non-volatile memory system uses dual row/column decoders and read/write circuits. Access to the memory array 200 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 200. In this way, the density of the read/write modules is essentially reduced by one half FIG. 2A depicts an example block in a memory array, such as the memory array 200 of FIG. 1. See also FIG. 2B. The block 201 includes example bit lines BL0 (202), BL1 (204), . . . and f+1 word lines WL0 through WLf. SGS represents a common control line 208 for a source-side select gate, SGD represents a common control line 206 for a drain-side select gate, and line 210 represents a common source line for the block 201. Each bit line is in communication with a set of storage elements in a respective NAND string, such as NAND strings 212 and 214 associated with BL0 and BL1, respectively. In examples further below, the NAND string 212 is considered to be unselected for programming, and the NAND string 214 is considered to be selected for programming, as an example. Other NAND strings in the block can similarly be selected or unselected. All bit line programming can be used in which adjacent NAND strings in a block are programmed concurrently. That is, for a selected word line, adjacent storage elements in different NAND strings are programmed concurrently.

Figure 2B:
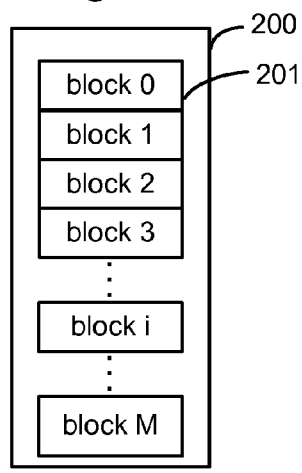
FIG. 2B depicts a memory array 200 comprising multiple blocks, such as the block 201 of FIG. 2A.

FIG. 2B depicts a memory array 200 comprising multiple blocks, such as the block 201 of FIG. 2A. As one example, a NAND flash EEPROM is described that is partitioned into M=1,024 blocks. The data stored in each block can be simultaneously erased. In one embodiment, the block is the minimum unit of storage elements that are simultaneously erased. Storage elements can be erased by raising the p-well to an erase voltage (e.g., 14-22 V) and grounding the word lines of a selected block while floating the source and bit lines. Erasing can be performed on the entire memory array, separate blocks, or another unit of the storage elements which is a portion of the memory device. During erasing, electrons are transferred from the floating gates of the storage elements to the p-well region so that the Vth of the storage elements becomes negative. A strong electric field is applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the Vth of a selected storage element is lowered.

Figure 3A:
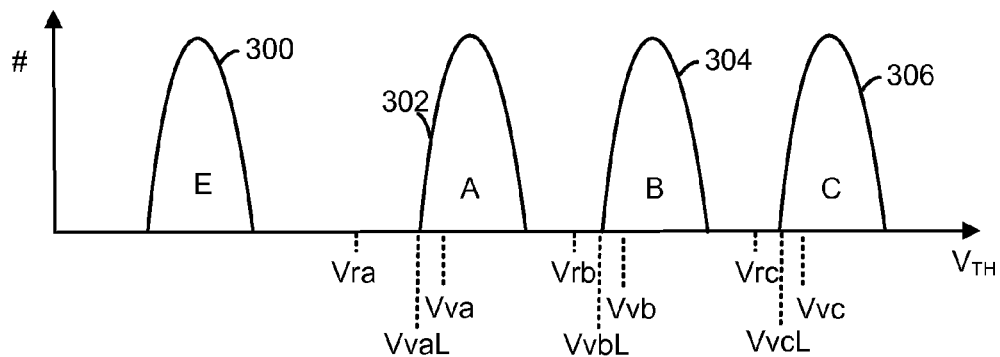
FIG. 3A depicts an example set of threshold voltage distributions.

FIG. 3A depicts an example set of threshold voltage distributions for a four-state memory device in which each storage element stores two bits of data. A first threshold voltage (Vth) distribution 300 is provided for erased (E-state) storage elements. Three Vth distributions 302, 304 and 306 represent programmed states A, B and C, respectively. In one embodiment, the threshold voltages in the E-state and the threshold voltages in the A, B and C distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 4A:
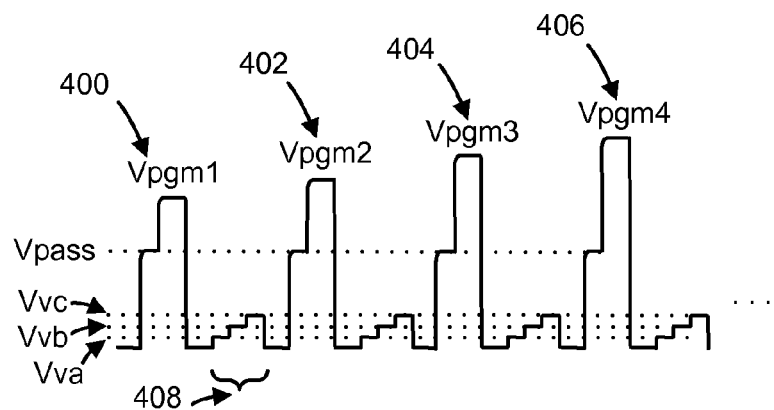
FIG. 4A depicts a series of program and verify pulses which are applied to a selected word line during a programming operation.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses such as depicted in FIG. 4A will then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some case, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.5-1.0 V, which is between a nominal program or non-inhibit level, e.g., 0 V and a full inhibit level, e.g., 2-4 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 3B:
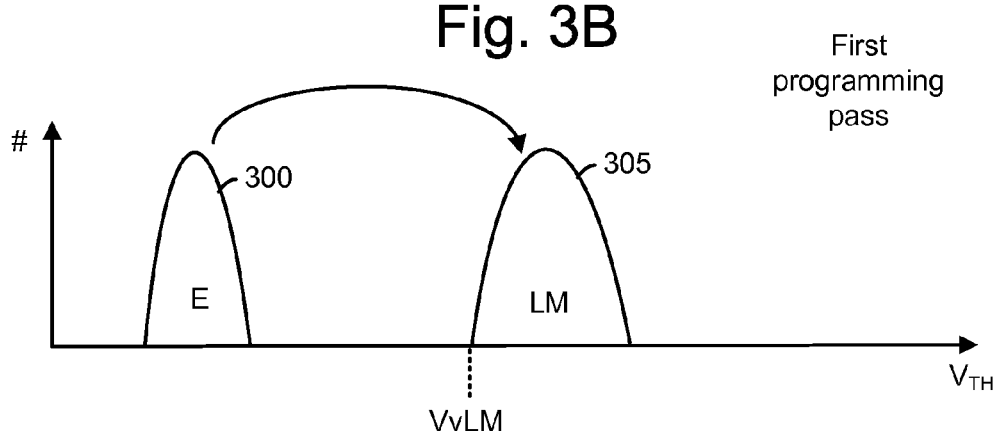
FIG. 3B illustrates a first pass of a two-pass programming technique.

FIG. 3B illustrates a first pass of a two-pass programming technique. In this example, a multi-state storage element that stores data for two different pages: a lower page and an upper page. Four states are depicted by repeating the threshold voltage distributions 300, 302, 304 and 306 from FIG. 3A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 300). If the data is to be programmed to 0, then the threshold voltage of the storage elements on WLn are raised such that the storage element is programmed to an intermediate (LM or lower middle) state (distribution 305).

Figure 4B:
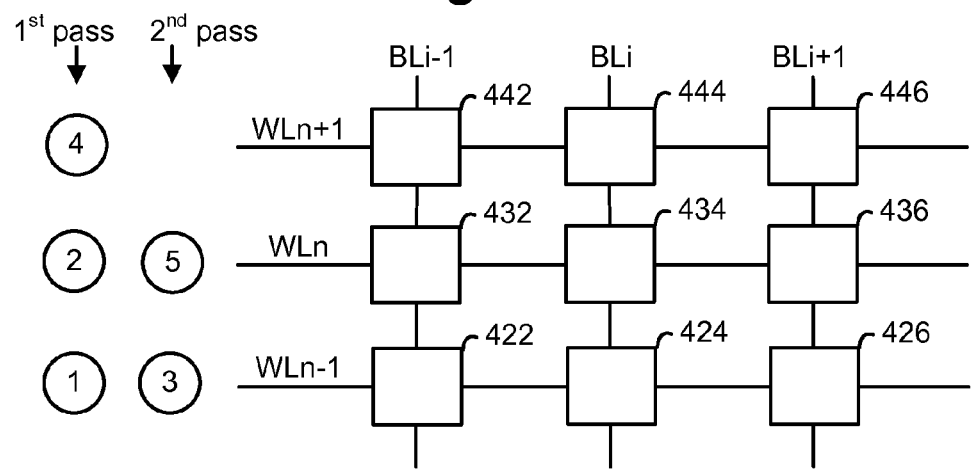
FIG. 4B depicts a multi-pass program operation for a set of storage elements.

In one embodiment, after a storage element is programmed from the E-state to the LM-state, as indicated by step "1" in FIG. 4B, its neighbor storage element on an adjacent word line WLn+1 in the NAND string will then be programmed with respect to its lower page in a respective first programming pass of the adjacent word line, as indicated by step "2" in FIG. 4B.

Figure 3C:
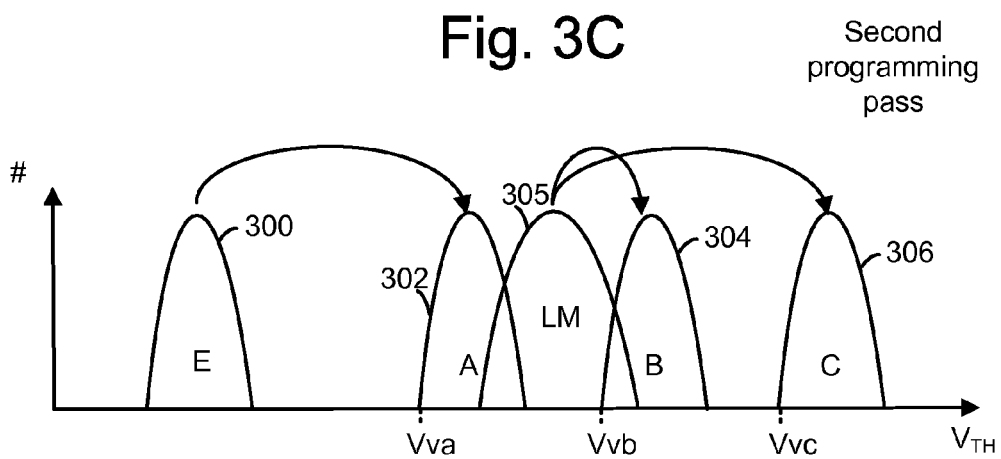
FIG. 3C illustrates a second pass of the two-pass programming technique of FIG. 3B.

FIG. 3C illustrates a second pass of the two-pass programming technique of FIG. 3B. The A-state storage elements are programmed from the E-state distribution 300 to the A-state distribution 302, the B-state storage elements are programmed from the LM-state distribution 305 to the B-state distribution 304, and the C-state storage elements are programmed from the LM-state distribution 305 to the C-state distribution 306. The second pass of the two-pass programming technique for WLn is indicated by step "3" in FIG. 4B. The second pass of the two-pass programming technique for WLn+1 is indicated by step "5" in FIG. 4B.

FIG. 3D illustrates a first pass of another two-pass programming technique. In this example, referred to as foggy-fine programming, the A-state, B-state and C-state storage elements are programmed from the E-state to distributions 312, 314 and 316, respectively, using lower verify levels VvaL, VvbL and VvcL, respectively. This is the foggy programming pass. A relatively large program voltage step size may be used, for instance, to quickly program the storage elements to the respective lower verify levels.

FIG. 3E illustrates a second pass of the two-pass programming technique of FIG. 3D. The A-state, B-state and C-state storage elements are programmed from the respective lower distributions to respective final distributions 302, 304 and 306, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts taught can be applied to other implementations with more or fewer than four states and more or fewer than two pages. For example, memory devices with eight or sixteen states per storage element are currently planned or in production.

Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

FIG. 4A depicts a series of program and verify pulses which are applied to a selected word line during a programming operation. A programming operation may include multiple program-verify iterations, where each iteration applies a program voltage followed by verify voltages, to a selected word line. In one possible approach, the program voltages are stepped up in successive iterations. Moreover, each program voltage may include a first portion which has a pass voltage (Vpass) level, e.g., 6-10 V, followed by a second, highest amplitude portion at a program level, e.g., 12-25 V. For example, a first, second, third and fourth program pulses 400, 402, 404 and 406 have program pulse levels of Vpgm1, Vpgm2, a Vpgm3 and Vpgm4, respectively, and so forth. One or more verify voltages, such as example verify voltages Vva, Vvb and Vvc (408), may be provided after each program pulse. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

FIG. 4B depicts a multi-pass program operation for a set of storage elements. The components depicted may be a subset of a much larger set of storage elements, word lines and bit lines. In one possible program operation, storage elements on WLn−1, e.g., storage elements 402, 424 and 426, are programmed in a first programming pass. This step is represented by the circled "1." Next ("2"), storage elements on WLn, e.g., storage elements 432, 434 and 436, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Note that these pass voltages are often referred to as read voltages, or Vread, as these voltages are only applied during read or verify operations. Next ("3"), storage elements on WLn−1 are programmed in a second programming pass. Next ("4"), storage elements on WLn+1, e.g., storage elements 442, 444 and 446, are programmed in a first programming pass. Next ("5"), the storage elements on WLn are programmed in a second programming pass to their respective target states.

FIG. 5A depicts a cross-sectional view of an unselected NAND string showing a first channel boosting technique, in which a single boosted channel region is provided in the unselected NAND string 212 of FIG. 2A. Portions 502 and 504 of other NAND strings which are arranged end-to-end with the NAND string 212 are also depicted. The view is simplified and not to scale. The NAND string 212 includes a source-side select gate 519 connected to SGS control line 208, a drain-side select gate 552 connected to SGD control line 206, thirty-two non-volatile storage elements 520-551 (in communication with word lines WL0 to WLf, respectively), all of which are formed, at least partly, on a substrate 510, which can include an insulating layer. A source-side select gate 517 and a storage element 516 are part of the NAND string portion 502, while a drain-side select gate 553 and a storage element 554 are part of the NAND string portion 504.

The source supply line 210 of FIG. 2A with a potential of Vs is provided between the select gates 517 and 519, while the bit line 202 of FIG. 2A with a voltage of Vbl is provided between the select gates 552 and 553.

A NAND string is typically formed in a p-well region of the substrate 510. The p-well region in turn may be within an n-well region of a p-type substrate. Each storage element includes a stacked gate structure that includes a control gate above a floating gate. The floating gates can be formed on the surface of the p-well on top of an oxide or other dielectric film. The control gate is above the floating gate, with an inter-polysilicon dielectric layer separating the control gate and floating gate. The control gates of the memory cells form the word lines. N+ doped regions (e.g., example source/drain region 507) in the substrate are shared between neighboring cells, whereby the cells are connected to one another in series to form a NAND string. These n+ doped regions form the source and drain of each of the cells. In one embodiment, n+ doped regions are not used and the channel areas in between adjacent memory cells are made conducting by fringing field effects that create electron rich regions that carry out the same function as the n+ doped regions.

Other types of non-volatile memory cells can also be used, such as memory cells in which the floating gate is replaced by a thin trapping layer such as Silicon Nitride in a so-called MONOS structure.

During programming, a programming voltage Vpgm is provided on a selected word line WLn, e.g., a word line associated with one or more storage elements to be programmed, such as storage element 537. Further, recall that the control gate of a storage element may be provided as a portion of the word line. For example, WL0 to WLf can extend via the control gates of storage elements 520-551, respectively. The word line voltages are therefore applied to all of the NAND strings, including selected and unselected NAND strings.

For the unselected NAND string, channel boosting techniques attempt to reduce the incidence of program disturb by boosting a channel area 506 of a substrate below an unselected NAND string during the program portion of a program-verify iteration. To achieve this, the source-side select gate 519 and the drain-side select gate 552 are rendered non-conductive, and voltages are applied to the unselected word lines. These voltages capacitively couple to the channel 506, thereby boosting the channel potential. For example, a pass voltage Vpass-s is applied to word lines in communication with storage elements 520-536 on the source side of WLn, and a pass voltage Vpass-d is applied to word lines in communication with storage elements 538-551 on the drain side of the selected word line. The source side of WLn is the side toward the source line 210, and the drain side of WLn is the side toward the drain line 206. Vpass-s and Vpass-d can be the same, in one approach. However in some cases, it can be more advantageous to use Vpass-s>Vpass-d to compensate for a reduction in channel boosting due to a source-to-drain programming order in which channel boosting is less for storage elements that are already in a programmed state.

An unselected storage element or NAND string may be referred to as an inhibited or locked out storage element or NAND string, respectively, as it is inhibited or locked out from programming in a given program-verify iteration of a programming operation. The channel region 506 represents a conductive path in the substrate, extending along the NAND string, from doped region to doped region. Boosting can be achieved in different ways. For example, in a pre-charge operation, which occurs before a pass voltage is applied to an unselected word line, a voltage supplied on the bit line 202 can be passed to the channel 506 via the drain-side select gate transistor 552. In one possible scenario, with an appropriate bit line voltage, the drain-side select gate transistor 552 provides a voltage of Vsgd−Vth to the channel, where Vsgd is the select gate voltage and Vth is the threshold voltage of the drain-side select gate transistor. In this case, Vsgd is set to a lower level in which the drain side select gate acts as a source-follower. During the pre-charge operation, the drain-side select gate transistor becomes non-conductive or at least less conductive, so that the bit line is effectively cutoff from the channel 506, and the pre-charge potential Vsgd−Vth is maintained in the channel. Subsequently, additional channel boosting can be achieved by applying pass voltages to the unselected word lines and maintaining the drain-side select gate transistor non-conductive. As mentioned, the pass voltages couple to the channel, raising its potential. In other embodiments, during the pre-charge operation, the drain side select gate voltage is raised to a higher level which allows the drain side select gate to act as a pass gate and transfer the bit line voltage Vbl to the channel area 506. At the end of the pre-charge operation, the select gate voltage is lowered to the lower level to render the drain side select gate non-conductive. The advantage of such an embodiment is that the channel 506 can be pre-charged to a higher level and thus result in higher channel boosting when subsequently the pass voltages are applied.

In this example boosting technique, a single channel is formed along the entire NAND string. In various other channel boosting techniques, multiple channel regions which are isolated from one another are associated with each unselected NAND string, based on isolation voltages which are applied to the word lines. Examples of such channel boosting techniques are discussed further below.

FIG. 5B1 is a graph showing channel boosting levels in the substrate of the unselected NAND string of FIG. 5A, in one embodiment. The y-axis depicts a channel boosting level Vch and the x-axis depicts a distance in the substrate 510 along, and directly under, the NAND string 212. The x-axes of FIGS. 5A, 5B1 and 5B2 are aligned. A disadvantage of this boosting technique is that the boosting level is uneven—it is lower on the source side of the selected word line (Vch-s, waveform 512) than on the drain side of the selected word line (Vch-d, waveform 514). Generally, the amount of boosting of a channel region is proportional to a level of the voltages, and to a rate of increase of the voltages, on the word lines which are directly over the channel region, less a Vth of the storage elements.

Vch-d can exceed Vch-s when programming of storage elements along selected NAND strings progresses from word line to word line, starting from the lower-numbered (source side) word lines, e.g., WL0, WL1, . . . and progressing to the higher-numbered (drain side) word line, e.g., . . . WLf-1, WLf. In this case, when the higher-numbered word lines are used for programming, the storage elements in communication with the lower-numbered word lines already have been programmed, at least in part. Thus, for a given NAND string, all or some of storage elements which are below (on the source side of) the selected word line will have electrons programmed into and stored in their respective floating gates, and all or some of the other storage elements which are above (on the drain side of) the selected word line will be erased or partially programmed, depending on the programming mode. With the boosting technique of FIG. 5A, areas of the channel which are associated with the erased or only partly programmed storage elements experience relatively higher boosting, and areas of the channel which are associated with the fully programmed storage elements experience relatively lower boosting. During the boosting, the difference in boosted channel level Vch-d and Vch-s will reduce as electrons will flow from the highly boosted area 514 to the lowly boosted area 512. As a result, the boosted channel level will reduce as more and more storage elements in the NAND string are programmed. An equalized boosting level may be reached as indicated by the dashed line 513. This reduction in channel boosting level can be reduced or compensated by applying higher pass voltages to storage elements that are already in a programmed state, or more specifically, applying a higher pass voltage (e.g., Vpass-s>Vpass-d) to word lines on the source side of the selected word line than to word lines on the drain side of the selected word line.

See FIGS. 12A and 12B for corresponding figures for a selected NAND string which experiences essentially no channel boosting.

FIG. 5B2 is a graph showing channel boosting levels in the substrate of the unselected NAND string of FIG. 5A, in another embodiment. Here, a number of chosen unselected word lines which are close to WLn receive an increasing voltage during a program pulse time period to increase boosting of a portion 509 of the channel region 506 which is directly under the chosen unselected word lines and directly under WLn. The chosen unselected word lines could be associated with storage elements 534-536 and 538-540, for instance. Unselected word lines which are not close to WLn do not receive an increasing voltage during the program pulse time period so that boosting is not increased in portions 508 and 511 of the channel region 506 which are directly under the unselected word lines which are not close to WLn. The unselected word lines which are not close to WLn could be associated with storage elements 520-533 and 541-551, for instance. The portions 508 and 511 are depicted at an equalized level. Thus, an increasing voltage is applied to a chosen number of unselected word lines which are within a specified number of word lines from the selected word line, on either side of the selected word line. Optionally, an increasing voltage is not applied to other unselected word lines which are not within the specified number of word lines from the selected word line, on either side of the selected word line. See also the discussion in connection with FIG. 5J.

FIG. 5C depicts a voltage applied to a selected word line during a program portion of a program-verify iteration. The horizontal direction denotes time, while the vertical direction denotes amplitude. The waveforms of FIGS. 5C-5I are time aligned. The time increments are not necessarily equally spaced. Waveform 590 depicts a nominal step up, discussed here, and waveform 592 depicts a case with a slow step up, as discussed further in connection with FIGS. 10C-10I.

Vwl-sel (a selected word line voltage) is at 0 V (or another low voltage) from t0-t1. At a step up time t1, Vwl-sel is stepped up from 0 V to a pre-program pulse level, Vpre-program, which can be the same as one or more pass voltages which are applied to one or more unselected word lines. This level, denoted by Vpass, can reach a substantially steady state level by t2, and remain at that level from t2-t4. Or, Vwl-sel can continue to increase at a given rate until t4 is reached. t4 is a next step up time in which Vwl-sel is increased to a program pulse level Vpgm and is maintained at least at that level during a program pulse time period of t5-t8. t4 to t5 may be a transition or step up period. Note that the step-up or ramp at t1 can be at a different rate than the step-up or ramp at t4. Alternatively, Vpre-program can differ from Vpass. For example, Vpre-program could be 0 V (or another low voltage) in which case Vwl-sel is stepped up directly from 0 V to Vpgm.

FIG. 5D depicts a fixed voltage applied to unselected word lines during a program portion of a program-verify iteration, e.g., consistent with the channel boosting technique of FIG. 5A. Vwl-unsel (an unselected word line voltage) steps up at t1, along with Vwl-sel, in one approach, and remains fixed at Vpass during the program pulse time period. Generally, different types of unselected word line voltages (e.g., Vpass, Vpass-s/d and Vpass-lsb) can be independent and can have their own step up or ramp rate starting at t1 and starting at t4 or t5 or even later. We can distinguish two step up or ramp rates: a first one from 0 V to Vpass starting at t1, and a second one starting at t4, t5 or later.

FIG. 5E depicts a channel boosting level in the substrate of the NAND string, e.g., for the channel boosting technique of FIG. 5A, when the unselected word line voltage of FIG. 5D is used. Optionally, Vbl is increase (FIG. 5F) at t0, causing a pre-charge voltage, Vpre-charge, in the channel. When Vwl-unsel and Vwl-sel are stepped up to Vpass at t1, there is a corresponding increase in Vch. However, it has been observed that the channel boosting level is typically not maintained at a fixed level, but dissipates, due to the occurrence of leakage currents, during the program pulse time period, when a fixed pass voltage is used. There are various possible sources of channel leakage, e.g., leakage to poorly boosted channel regions, temperature-dependent leakage due to the reverse biased channel area, and leakage currents caused by GIDL (Gate Induced Drain Leakage) especially close to storage elements that have a relatively low biased word line voltage and are in a high programmed state. Leakage can occur generally with any channel boosting scheme, regardless of whether there is one continuous channel region, such as in FIG. 5A, or multiple channel regions defined by isolation voltages, such as in FIGS. 8A, 9A and 10A. As a result, the likelihood of program disturb is increased. Boosting techniques which address this problem are described in detail further below.

FIG. 5F depicts a voltage applied to a bit line 202 of the unselected NAND string of FIG. 5A during a program portion of a program-verify iteration. Waveform 560 depicts an elevated voltage Vbl such as Vdd, e.g., 2-3 V, which is applied to the unselected NAND string at t0 to render the drain-side select gate non-conductive. Some pre-charge (Vpre-charge) of the channel occurs due to Vbl reaching the channel before the drain-side select gate is rendered non-conductive. The select gate is rendered non-conductive when its select gate voltage does not exceed the sum of Vbl and the Vth of the select gate. A pre-charge and a boosting level can be maintained in the substrate channel region below the unselected NAND string when the select gates are non-conductive. In contrast, waveform 562 depicts a Vbl which is applied to the bit line 204 of the selected NAND string to render the drain-side select gate conductive, so that boosting is not maintained in the substrate channel region below the selected NAND string. See also FIG. 12B. On the contrary, grounding the bit line and channel allows programming to occur in a selected storage element of the selected NAND string. In some programming schemes, Vbl is set above zero but below Vdd to partially inhibit, or slow down, the rate of programming.

FIG. 5G depicts a voltage applied to a line 206 in communication with a drain-side select gate of the unselected NAND string of FIG. 5A during a program portion of a program-verify iteration. As mentioned, at t0, Vsgd is set to a high level such as Vdd, to render the drain-side select gate conductive for a selected NAND string for which Vbl=0 V, or to render the drain-side select gate non-conductive for an unselected NAND string for which Vbl=Vdd. Vsgd can rise before, at the same time, or after Vbl. In other embodiments, during the pre-charge operation from t0 to t1, the drain side select gate voltage is raised to a voltage higher than Vsgd or Vdd to be able to transfer the bit line voltage Vbl to the channel area 506. At the end of the pre-charge operation, the select gate voltage is lowered to Vsgd or Vdd to render the drain-side select gate non-conductive. The advantage of such an embodiment is that the channel 506 can be pre-charged to a higher level and thus result in higher channel boosting when subsequently the pass voltages are applied.

FIG. 5H depicts a voltage applied to a source line 210 of the unselected NAND string of FIG. 5A during a program portion of a program-verify iteration. Vs is set to a high level such as Vdd. The source line is common to all of the NAND strings, whether selected or unselected, in a block, in one configuration. In other embodiments, a voltage lower than Vdd, such as 1-2 V, can be applied.

FIG. 5I depicts a voltage applied to a line 208 in communication with a source-side select gate of the unselected NAND string of FIG. 5A during a program portion of a program-verify iteration. Vsgs is set to 0 V to render the source-side select gates non-conductive for the selected and unselected NAND strings, due to Vs being set high. Note that in general, even without applying a high Vs voltage, the source-side select gate can be non-conductive, however, by applying the bias voltage >0V the isolation characteristics of the source-side select gate are further improved.

FIG. 5J depicts a voltage applied to an unselected word line during a program portion of a program-verify iteration, where the voltage is increased in a linear or non-linear ramp, such as for the first channel boosting technique of FIG. 5A. Specifically, to counteract channel boosting leakage, discussed, e.g., in connection with FIG. 5E, Vwl-unsel is gradually increased in a controlled manner during all, or a portion of, the program pulse time period, when program disturb is most likely to occur. The increase is indicated by the sloped solid line from t4-t8, which reaches a maximum level of Vmax. The power control module 116 of the control circuitry 100 may be configured for this purpose, as discussed further in connection with FIG. 1. This gradual increase serves to reduce or compensate the drop in the channel boosting level by counteracting or compensating the channel leakage current. In some cases, some reduction of the channel boosting level may still occur, but at a reduced rate. The gradual increase in Vwl-unsel can be linear (e.g., waveform 570), at a fixed rate of increase, or non-linear (e.g., waveform 572), at a varying rate of increase, over time. Further, the increase can be essentially continuous, e.g., ramp-like, based on the lowest increment of voltage which the power control module 116 can provide, or step-wise, such as depicted in FIG. 5L. Vwl-unsel can increase during a majority, e.g., over half, of the program pulse time period of t5-t8. Vwl-unsel thus increases within the program pulse time period. In the approach shown, Vwl-unsel begins increasing at t4, at the same time Vwl-sel is stepped up from Vpre-program and begins to approach Vpgm. Generally, the risk of program disturb is greatest when Vwl-sel has reached a high level such as Vpgm, so the time period in which Vwl-unsel increases should correspond to the time period in which Vwl-sel is high or is transitioning or close to the final high level.

In the approach shown, the increase is ramp like, increasing gradually or substantially continuously during the program pulse time period, at a fixed rate or slope. The increase in Vwl-unsel can be the same (e.g., same slope and duration of increase) for different program-verify iterations in which different levels of Vpgm are used. In another approach, the increase in Vwl-unsel is a function of Vpgm, so that a higher rate of increase and/or a longer duration of increase is used when Vpgm is higher. Thus, in the earlier program-verify iterations of a program operation, no increase, or a lower increase in Vwl-unsel is used, and in later program-verify iterations of the program operation, an increase, or higher increase, in Vwl-unsel is used. This approach accounts for the fact that program disturb is greatest when Vpgm is greatest, so that the countermeasure of increasing Vwl-unsel can be tailored to the level of Vpgm. In yet another approach, Vwl-unsel at the beginning of the programming pulse (t4) can be dependent on Vpgm as well. This approach accounts for the fact that program disturb is greatest when Vpgm is greatest, so that the countermeasure of also using a higher Vwl-unsel at the beginning of the programming pulse can be tailored to the level of Vpgm. That is, an initial level (e.g., Vpass) of Vwl-unsel, at the beginning of the programming pulse (e.g., at t4), can be higher when the program pulse voltage is higher.

Moreover, all unselected word lines, or only particular unselected word lines, can receive an increasing voltage. Thus, some unselected word lines can receive an increasing voltage while others receive a fixed voltage. For example, in FIG. 5A and 5B2, where there is one continuous channel region 506 along the entire NAND string, chosen unselected word lines which are close to the selected word line could receive the gradually an increasing Vsl-unsel such as waveforms 570 or 572. This would increase the boosting level in the portion 509 of the channel region which is directly under the chosen unselected word lines and directly under the selected word line, where it is most needed to prevent disturbs. For instance, close word lines such as WLn−3 to WLn−1 and WLn+1 to WLn+3 could receive the waveform of FIG. 5J, which increases during the program pulse time period, while other unselected word lines, further from the selected word line, receive the waveform of FIG. 5D, which does not increase during the program pulse time period. The close word lines could alternatively receive another waveform which increases during the program pulse time period, such as shown in FIGS. 5L, 7A, 7B, 10C and 10F. A specified number N1 of word lines on the source side of WLn and a specified number of word line N2 on the drain side of WLn, can receive a waveform which increase during the program pulse time period. N1 and N2 are integer numbers greater or equal than one, and can be the same or different.

It is also possible for different unselected word lines to receive voltages which increase at different rates. For example, unselected word lines which are closer to the selected word line, such as WLn−1 and WLn+1, can receive a higher increase and/or start at a higher level than unselected word lines which are farther from the selected word line. Vpass(n+1) is a voltage applied to WLn+1, and Vpass(n+1) is a voltage applied to WLn+1. Vpass(n−1/n+1) represents both voltages. This mode of biasing, which applies to any of the boosting techniques herein, reduces the voltage difference between the selected WL (WLn) and the adjacent neighbor word lines (WLn−1 and WLn+1) to reduce the possibility of breakdown or leakage between those word lines. Also, a higher bias voltage on the neighboring word lines assists in programming the memory cells on the selected word line by providing extra "parasitic" coupling. As a result, the programming voltage on the selected word line can be reduced compared to the case where the neighboring unselected word lines do not use a higher voltage than the non-neighboring unselected word lines. Further, the unselected word lines (WLn−2, WLn−3, . . . ) on the source side of the selected word line may received a higher voltage than the unselected word lines (WLn+2, WLn+3, . . . ) on the drain side of the selected word line, since cells on the source side are already programmed and are less susceptible to program disturb, or more accurately, Vpass disturb. Thus, a higher Vpass on those word lines is possible without increasing the likelihood of program disturb (e.g., Vpass disturb).

Increasing the voltages of the unselected word lines during the program pulse time period is advantageous because it compensates or reduces the effect of channel leakage while avoiding disadvantages of other approaches. For example, reducing the program pulse time period (the program pulse width) would reduce the effect of channel leakage, resulting in a reduction of the boosted channel level, and the total amount of channel leakage, since the leakage occurs over a shorter period of time, but at the expense of increasing the final Vpgm which is needed to complete programming and possibly even increasing the programming time as more programming loops maybe needed. Moreover, reductions in the program pulse time period are limited by the word line RC delay.

FIG. 5K depicts a channel boosting level in the substrate of the NAND string of FIG. 5A, e.g., based on the unselected word line voltages of FIG. 5J. The channel boosting level is approximately constant, as an example, due to the increasing Vwl-unsel that compensates for the channel leakage. As mentioned, generally, the amount of boost of a channel region is proportional to a level of the voltages, and to a rate of increase of the voltages, on the word lines which are directly over the channel region, less a Vth of the storage elements. By maintaining an approximately constant channel boosting level during the program pulse time period, program disturb can be reduced compared to the case where channel boosting level decreases during the program pulse time period, as in FIG. 5E. Some channel boosting level decrease could still occur, but it will be less than the case where Vwl-unsel is constant.

FIG. 5L depicts a step-wise increasing voltage applied to an unselected word line during a program portion of a program-verify iteration, as an alternative to the ramped voltage of FIG. 5J. The amplitude change (step height or rise) and/or duration of each step can be configured. In one approach, the step heights in the staircase are approximately equal and/or the step durations are approximately equal. A maximum level of Vmax is reached. If unequal step heights are used, larger steps could be followed by smaller steps, for example, or vice-versa. If unequal step durations are used, longer steps could be followed by shorter steps, for example, or vice-versa. The step height may be greater than the lowest increment of voltage which the power control module 116 can provide. A waveform which combines discrete steps with a ramp could also be used. Other variations are possible. Temperature-based variations to Vwl-unsel can also be used, as discussed further below. Or, Vwl-unsel can be temperature-independent.

FIG. 5M depicts a channel boosting level in the substrate of the NAND string of FIG. 5A, e.g., based on the unselected word line voltage of FIG. 5L. The channel boosting level generally decreases when Vwl-unsel is constant, e.g., during the run of a step, and increases during the rise of a step, so that a repeated pattern of decreasing and increasing is expected. The program pulse time period t5-t8 is depicted for reference.

Another consideration in reducing program disturb is that temperature changes in a memory device can affect the channel boosting level. For example, FIG. 6A depicts a graph showing bit errors as a function of pass voltage for unselected word lines for a typical boosting technique, for different temperatures.

Program disturb related bit errors are typically highest for storage elements in the erased state. The y-axis depicts a number of bit errors and the x-axis depicts a pass voltage. Curves 600, 602 and 604 provide data for temperatures of 25° C., 55° C. and 85° C., respectively. Each curve has a different point (a minimum, marked by a dot) at which the number of errors is minimal. This is the optimum pass voltage, e.g., Vpass-opt1, Vpass-opt2 or Vpass-opt3 for curve 600, 602 or 604, respectively. At higher temperatures, a higher Vpass can result in fewer errors due to better channel boosting, up to a certain point, which is the optimum Vpass. Above the optimum Vpass, errors are increased due to Vpass disturb. The optimum Vpass is lower for lower temperatures.

Figure 6A:
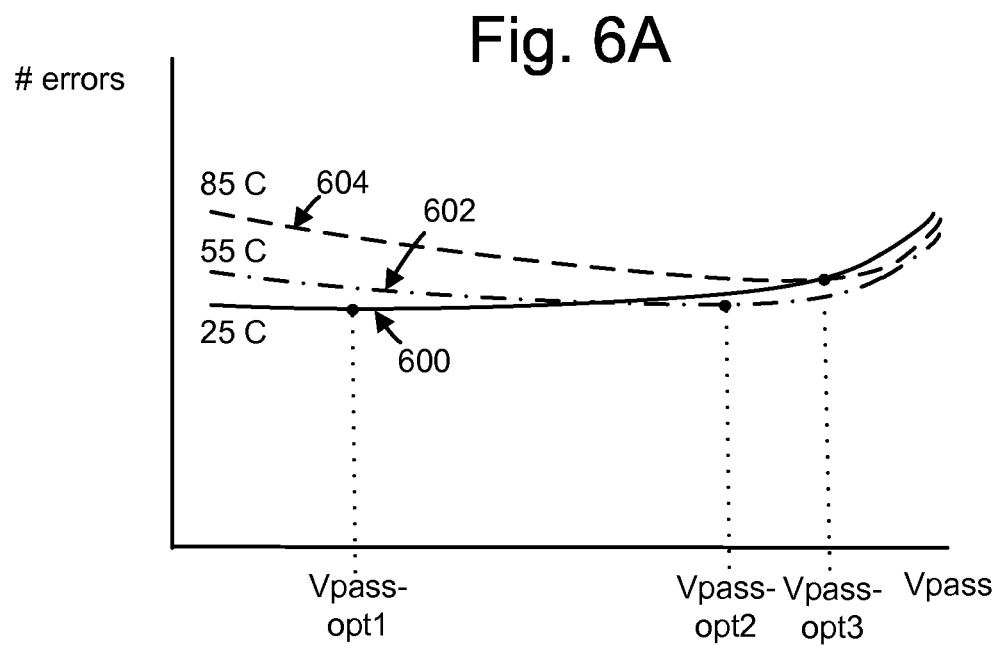
FIG. 6A depicts a graph showing bit errors as a function of pass voltage for unselected word lines for a typical boosting technique, for different temperatures.
Figure 6B:
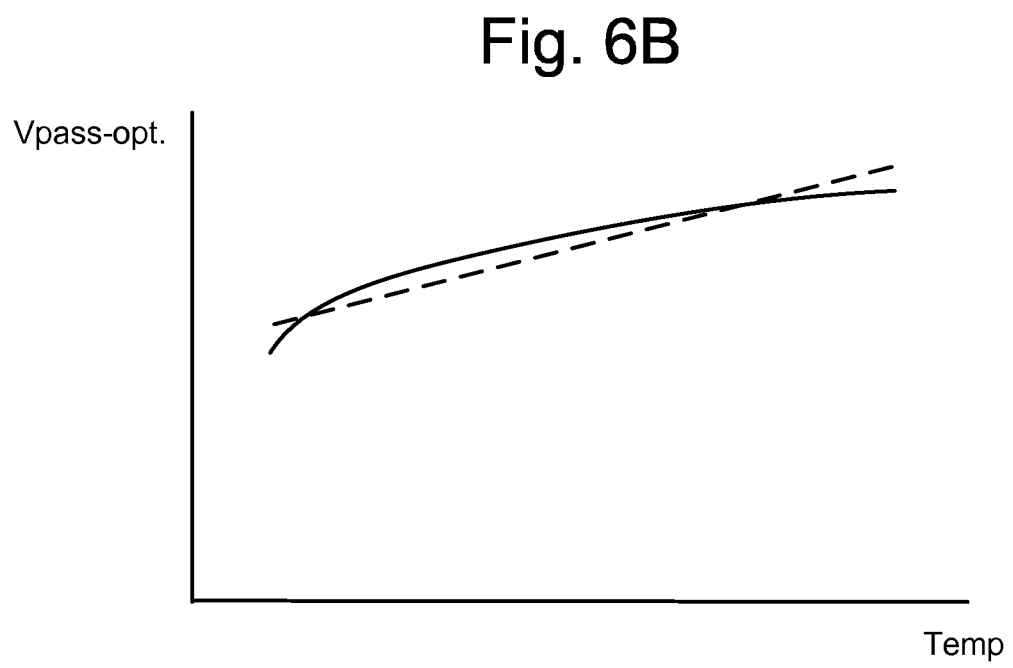
FIG. 6B depicts an optimum pass voltage for unselected word lines for a typical channel boosting technique, as a function of temperature, consistent with FIG. 6A.

FIG. 6B depicts an optimum pass voltage for unselected word lines for a typical channel boosting technique, as a function of temperature, consistent with FIG. 6A. The optimum Vpass can be approximated as a linear function of temperature (dashed line). As a result, the change in the optimum Vpass as a function of temperature can be described by a constant temperature coefficient. By adjusting the pass voltages of unselected word lines during programming as a function of temperature, the performance of the memory device can be improved. In particular, a higher pass voltage can be used when the temperature is higher. Similarly, in a boosting technique which increases the pass voltage during the program pulse time period, a higher rate of increase and/or a longer duration of increase, can be used when the temperature is higher.

Figure 7A:
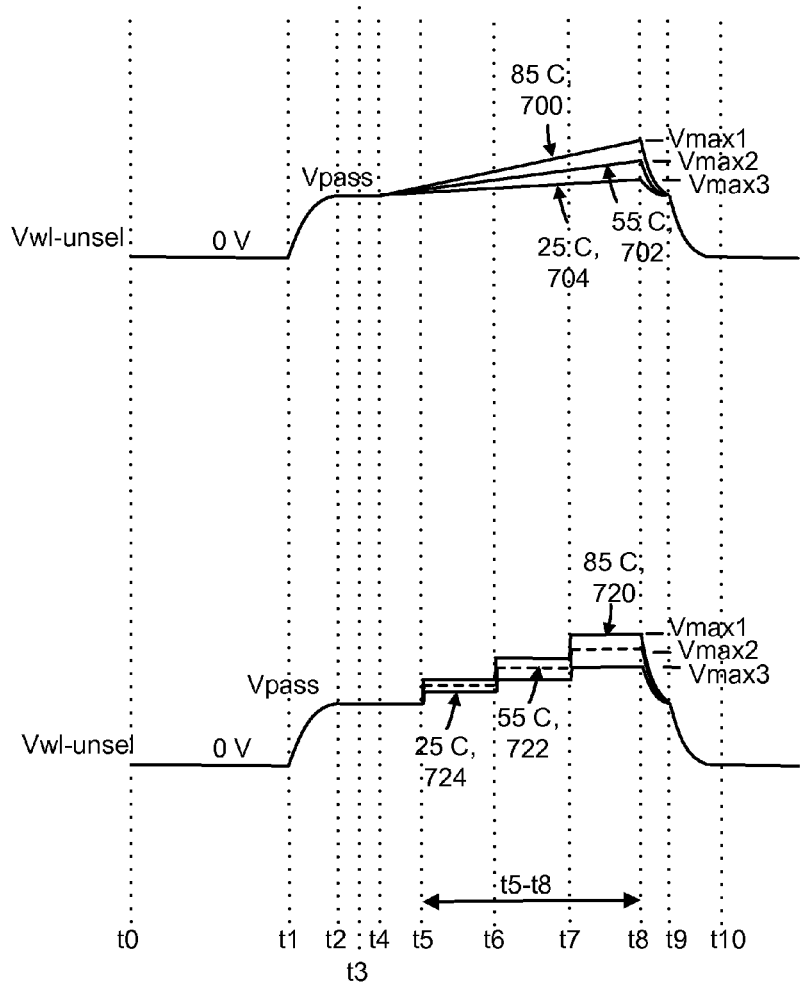
FIG. 7A depicts a voltage applied to an unselected word line during a program portion of a program-verify iteration, where the voltage is increased like a ramp, as a function of temperature, such as for the first channel boosting technique of FIG. 5A.

FIG. 7A depicts a voltage applied to an unselected word line during a program portion of a program-verify iteration, where the voltage is increased like a ramp, as a function of temperature, such as for the first channel boosting technique of FIG. 5A. As an extension of the discussion in connection with FIG. 5J, waveforms 700, 702 and 704 can be used for a relatively high temperature such as 85° C., an intermediate temperature such as 55° C., and a relatively low temperature such as 25° C., respectively. Maximum levels of Vmax1, Vmax2 and Vmax3 are reached. In one possible approach, a given waveform is used for a range of temperatures. For example, waveform 700 can be used for temperatures of 70° C. or higher, waveform 702 can be used for temperatures from 40-70° C. and waveform 704 can be used for temperatures below 40° C. By tailoring the rate of increase to temperature, program disturb can be optimally reduced even in different temperature environments of the memory device. Moreover, since Vpass is lower when the temperature is lower, Vpass disturb at lower temperatures is reduced.

The ramp rate can be set by a coefficient which describes the rate of change of Vwl-unsel per unit of time as a function of temperature.

FIG. 7B depicts a step-wise increasing voltage applied to an unselected word line during a program portion of a program-verify iteration, as a function of temperature, as an alternative to the ramped voltage of FIG. 7A. As an extension of the discussion in connection with FIG. 5L, waveforms 720, 722 and 724 can be used for 85° C., 55° C. and 25° C., respectively. Maximum levels of Vmax1, Vmax2 and Vmax3 are reached. In one possible approach, a given waveform is used for a range of temperatures. For example, waveform 720 can be used for temperatures of 70° C. or higher, waveform 722 can be used for temperatures from 40-70° C. and waveform 724 can be used for temperatures below 40° C. The step height and/or duration can be a function of temperature. In this example, the height of each step is a function of temperature (larger step height for higher temperatures) while the step durations (t8-t7, t7-t6 and t6-t5) are independent of temperature.

FIG. 8A depicts a cross-sectional view of the unselected NAND string 212 of FIG. 2A showing a second channel boosting technique. A first channel region 802 and a second channel region 800 are defined in the substrate 510 due to the application of an isolation voltage Viso-s on the source side of WLn, and the application of non-isolation voltages on other unselected word lines. This approach allows independent boosting levels to be achieved in the different channel regions. In one approach, the isolation voltage is applied to a word line which is relatively close to WLn, to provide separate channel boosting regions for programmed storage elements on the source side of WLn, and for unprogrammed or only partly programmed storage elements on the drain side of WLn. However, the isolation word line can be separated from WLn by a few word lines, for instance, so that the isolation voltage does not adversely affect the channel boosting level under WLn.

An isolation voltage can be a relatively small voltage such as 0-3 V which is sufficiently low to essentially isolate channel regions in the substrate on either side of the word line (an isolation word line) which receives the isolation voltage. In comparison, a nominal Vwl-unsel might be 6-10 V, for instance. Further, a set of multiple adjacent word lines can receive an isolation voltage to more strongly isolate the channel regions in the substrate on either side of the set of word lines which receives the isolation voltage. Additionally, to provide a gradual transition to the isolation region, one or more word lines which are adjacent to an isolation word line can receive a voltage (Vint) which is intermediate to Viso and the nominal Vwl-unsel.

In this example, Viso-s is applied to a word line which communicates with storage element 531, and Vint is applied to the unselected word lines which are adjacent to the word line which receives Viso-s. Specifically, Vint is applied to word lines which communicate with storage elements 530 and 532. On the source side of the isolation word line, Vpass-s is applied to word lines which communicate with storage elements 520 to 529. Further on the drain side of the isolation word line, Vpass-lsb is applied to word lines which communicate with storage elements 533 to 536 and 538 to 551. Vpass-lsb is a local self-boosting voltage of, e.g., 6-10 V. WLn extends directly over the first channel region 802. The boosting of the channel region 800 is set by the voltages of the word lines which are directly above the channel region 800, resulting in the channel boosting profile 804 of FIG. 8B. A boosting level of Vch-s is achieved under the word lines which receive Vpass-s, while a lower boosting level is achieved under the word line (and storage element 530) which receives Vint. Similarly, a boosting level of Vch-lsb 808 is achieved under the word lines which receive Vpass-lsb, while a lower boosting level is achieved under the word line (and storage element 532) which receives Vint. An even lower boosting level that depends on the bias voltages Vint, Viso-s and the state of the storage elements may be achieved under the word line (and storage element 531) which receives Viso-s.

Since Vpass-lsb is applied to only a small number of word lines, in one approach, it may be higher than Vpass-d, as the storage elements will be exposed to Vpass-lsb for a shorter time than to Vpass-d. Vpass-s, relative to Vpass-lsb or Vpass-d, can be quite high because the associated storage elements are already programmed and therefore less susceptible to program disturb. Vpass-lsb maybe higher than Vpass-d as it is applied to fewer WLs and thus each WL is exposed a shorter total time to Vpass-lsb and thus Vpass disturb will be less of a concern. Further, a high Vpass may cause Vpass disturb on, for example, WLn+2 and 3, while it may be safe to apply a high Vpass to WLn-2 and n-3. In some embodiments, Vpass-lsb on the source side of WLn can be higher than Vpass-lsb on the drain side of WLn for this reason.

FIG. 8B is a graph showing channel boosting levels in the substrate of the unselected NAND string of FIG. 8A. The x-axes of FIGS. 8A and 8B are aligned. As mentioned, waveform 804 represents a boosting level on the source side of the isolation word line, while waveform 808 represents a boosting level on the drain side of the isolation word line.

FIG. 9A depicts a cross-sectional view of the unselected NAND string 212 of FIG. 2A showing a third channel boosting technique. This boosting technique essentially is a reverse of the technique of FIG. 8A, and uses an isolation voltage on the drain side of WLn instead of on the source side. Although, this boosting technique is less advantageous than others because it isolated the poorly boosted channel region area at the drain side.

Specifically, a first channel region 900 and a second channel region 902 are defined in the substrate 510 due to the application of an isolation voltage Viso-d on the drain side of WLn, and the application of non-isolation voltages on other unselected word lines. This approach allows independent boosting levels to be achieved in the different channel regions.

Viso-d is applied to a word line which communicates with storage element 543, and Vint is applied to the unselected word lines which are adjacent to the word line which receives Viso-d. Specifically, Vint is applied to word lines which communicate with storage elements 542 and 544. On the source side of the isolation word line, Vpass-lsb is applied to word lines which communicate with storage elements 520 to 536 and 538 to 541. Further on the drain side of the isolation word line, Vpass-d is applied to word lines which communicate with storage elements 545 to 551. WLn extends directly over the first channel region 900. The boosting of the channel region 900 is set by the voltages of the word lines which are directly above the channel region 900, resulting in the channel boosting profile 904 of FIG. 9B. A boosting level of Vch-lsb is achieved under the word lines which receive Vpass-lsb, while a lower boosting level is achieved under the word line (and storage element 542) which receives Vint. Similarly, a boosting level of Vch-d 908 is achieved under the word lines which receive Vpass-d, while a lower boosting level is achieved under the word line (and storage element 544) which receives Vint. An even lower boosting level may be achieved under the word line (and storage element 543) which receives Viso-d. Vpass-d can be the same as, or less than Vpass-lsb, for instance, when a source-to-drain word line programming order is used.

FIG. 9B is a graph showing channel boosting levels in the substrate of the unselected NAND string of FIG. 9A. The x-axes of FIGS. 9A and 9B are aligned. As mentioned, waveform 904 represents a boosting level on the source side of the isolation word line, while waveform 908 represents a boosting level on the drain side of the isolation word line.

FIG. 10A depicts a cross-sectional view of the unselected NAND string 212 of FIG. 2A showing a fourth channel boosting technique. This boosting technique combines the techniques of FIGS. 8A and 9A. It uses isolation voltages on both the source and drain sides of WLn. Specifically, a first channel region 1002, a second channel region 1004, and a third channel region 1000 are defined in the substrate 510 due to the application of an isolation voltage Viso-s on the source side of WLn, an isolation voltage Viso-d on the drain side of WLn, and non-isolation voltages on other unselected word lines.

This approach allows independent boosting levels to be achieved in the different channel regions. In one approach, the isolation voltages are applied to word lines which are relatively close to WLn, on either side of WLn, to provide separate channel boosting regions for programmed storage elements on the source side of WLn, unprogrammed or only partly programmed storage elements on the drain side of WLn and a small channel region which extends directly under WLn.

Viso-s is applied to a word line which communicates with storage element 531, and Vint is applied to the unselected word lines which are adjacent to the word line which receives Viso-s. Specifically, Vint is applied to word lines which communicate with storage elements 530 and 532.

Viso-d is applied to a word line which communicates with storage element 543, and Vint is applied to the unselected word lines which are adjacent to the word line which receives Viso-d. Specifically, Vint is applied to word lines which communicate with storage elements 542 and 544.

On the source side of the word line which receives Viso-s, Vpass-s is applied to word lines which communicate with storage elements 520 to 529. Between the word line which receives Viso-s and WLn, Vpass-lsb is applied to word lines which communicate with storage elements 520 to 529. Between WLn and the word line which receives Viso-s, Vpass-lsb is applied to word lines which communicate with storage elements 538 to 541. Between the word line which receives Viso-d and SGD, Vpass-d is applied to word lines which communicate with storage elements 545 to 551.

FIG. 10B is a graph showing channel boosting levels in the substrate of the unselected NAND string of FIG. 10A. The x-axes of FIGS. 10A and 10B are aligned. Boosting levels of Vch-lsb, Vch-d and Vch-s are achieved in the first, second and third channel boosting regions (waveforms 1010, 1012 and 1006, respectively), FIG. 10C depicts voltages applied to unselected word lines during a program portion of a program-verify iteration, e.g., for the channel boosting techniques of FIGS. 5A, 8A, 9A or 10A. The waveforms of FIGS. 5F-5I may be used with the waveforms of FIGS. 10C and 10D. The time scale in FIGS. 5F-5I corresponds with that in FIGS. 10C and 10D. Waveform 1066 depicts Viso-s or Viso-d (e.g., Viso-s/d), and waveform 1064 depicts Vint. Waveform 1060 depicts Vpass-s or Vpass-d (e.g., Vpass-s/d), and waveform 1062 depicts Vpass-lsb. For waveform 1062, a maximum level of Vmax is reached. For simplicity, Vpass-s, Vpass-d and Vpass-lsb are depicted as being stepped up to the same level at t1, although they can be stepped up to different levels, as discussed.

In this example, the unselected word lines which contribute to boosting of the channel which WLn extends directly over, have their voltages increase during the program pulse time period, and the unselected word lines which extend directly over another channel do not have their voltages increased during the program pulse time period. Alternatively, the unselected word lines which are close to WLn, e.g., within a few word lines on either side of WLn, can have their voltages increased during the program pulse time period. These approaches address the increased chance of program disturb for storage elements which are in communication with WLn by maintaining the associated channel boosting level (waveform 1070, FIG. 10D). In this approach, it is acceptable to allow the channel boosting level to decrease for one or more other channel boosting regions (waveform 1072, FIG. 10D), e.g., under word lines which are further away from WLn, since the risk of Vpass disturb is less. Limiting the unselected word lines for which Vpass increases also can reduce a risk of Vpass disturb for the associated storage elements.

A further aspect involves the rate at which the voltages are stepped up for the unselected word lines at t1. It has been found that a step up at a slower rate can be advantageous for the channel boosting region of WLn, compared to one or more adjacent channel boosting regions. Since channel boosting is stepped up sooner for the adjacent channel region, a bias is provided over the source/drain region of the isolation storage element, e.g., the storage element of an unselected NAND string which receives Viso-s/d. This can improve the isolation between the channel regions on either side of an isolation storage element and the corresponding isolation word line. With the slower boost up of the channel region under WLn, and the increase in Vpass-lsb, the boosting of the channel region under WLn becomes more robust as the effect of channel leakage current is suppressed or at least partly compensated so that program disturb is suppressed.

Waveform 1060 steps up starting at t1 and reaches substantially a steady state value at t2, for a step up time of t2 or a step up rate of Vpass-s/d/(t2-t1). Waveform 1062 steps up starting at t1 and reaches substantially a steady state value at t3, for a longer step up time of (t3-t1) or a slower step up rate of Vpass-lsb/(t3-t1). After a brief time at the steady state level, from t3 to t4, waveform 1062 begins its controlled increase at t4, at the same time Vwl-sel begins its step up to Vpgm. Before the program pulse time period, the voltage applied to the selected word line can similarly be stepped up at a slower rate than the rate at which Vpass-s/d is stepped up. See waveform 592 in FIG. 5C for an example of this slower step up rate. In one approach, the voltage applied to the selected word line can be stepped up at the same rate as the step up rate of Vpass-s/d.

FIG. 10D depicts channel boosting levels in the substrate of the NAND string of FIGS. 5A, 8A, 9A or 10A, e.g., based on the unselected word line voltages of FIG. 10C. Waveform 1070 indicates that the channel boosting level Vch-lsb is approximately constant when the increasing Vpass-lsb (waveform 1062 in FIG. 10C) is applied. Waveform 1072 indicates that the channel boosting level Vch-s or Vch-d (e.g., Vch-s/d) decreases when the fixed Vpass-s/d (waveform 1060 in FIG. 10C) is applied.

In the embodiment of FIG. 8A, waveform 1060 represents Vpass-s and waveform 1072 represents Vch-s and Vch-d. In the embodiment of FIG. 9A, waveform 1060 represents Vpass-d and waveform 1072 represents Vch-d.

FIG. 10E depicts a difference in the channel boosting levels of FIG. 10D. The difference is: ΔVch=Vch-s/d−Vch-lsb. Due to the faster ramp up of Vpass-s/d compared to Vpass-lsb, the boosting level is temporarily higher from about t1-t3 for Vch-s/d compared to Vch-lsb. As mentioned, this helps improve the isolation between the channel regions on either side of an isolation word line. By boosting the Vch-s/d slightly earlier and higher, two effects are accomplished. First, boosted charge/electrons from the Vch-s/d areas can flow to the Vch-lsb area, in that way, improving the boosting/pre-charging of the Vch-lsb area. And second, by boosting the Vch-s/d areas earlier, the isolation between the various boosted channel regions is improved as the conduction from the Vch-lsb area to the Vch-s/d areas will be reduced due to the higher bias on the Vch-s/d area which helps to make the storage elements that are controlled by Viso to be less conductive. Basically, electrons can flow from the Vch-s/d areas to the Vch-lsb area but it is harder to flow back to the Vch-s/d area after the Vch-lsb area starts boosting.

Figure 10F:
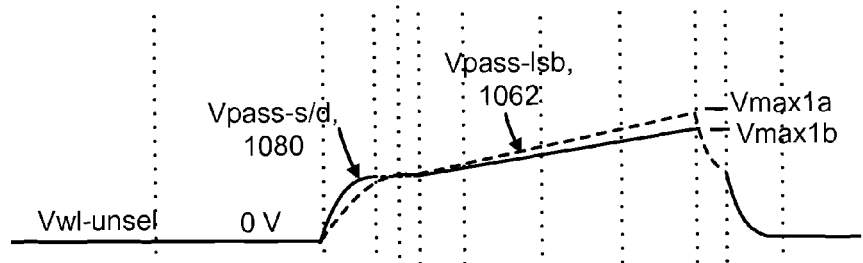
FIG. 10F depicts alternative voltages applied to unselected word lines during a program portion of a program-verify iteration, for the channel boosting techniques of FIGS. 8A, 9A or 10A.

FIG. 10F depicts alternative voltages applied to unselected word lines during a program portion of a program-verify iteration, e.g., for the channel boosting techniques of FIGS. 5A, 8A, 9A or 10A. In this approach, Vpass-s/d (waveform 1080) and Vpass-lsb (waveform 1062) are both increased during the program pulse time period, although they can be increased by different amounts. For example, the amount of increase of Vpass-lsb can be higher than for Vpass-s/d, in one approach. A stepped waveform, or other waveform shapes, could alternatively be used, as discussed previously. Maximum levels of Vmax1a and Vmax1b are reached for waveforms 1062 and 1080, respectively.

Figure 10G:
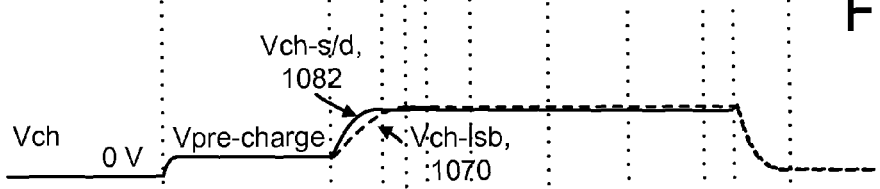
FIG. 10G depicts channel boosting levels in the substrate of the NAND string of FIGS. 8A, 9A or 10A e.g., based on the unselected word line voltages of FIG. 10F.

FIG. 10G depicts channel boosting levels in the substrate of the NAND string of FIGS. 8A, 9A or 10A e.g., based on the unselected word line voltages of FIG. 10F. Waveform 1070 indicates that the channel boosting level Vch-lsb is approximately constant when the increasing Vpass-lsb (waveform 1062 in FIG. 10F) is applied. Waveform 1082 indicates that the channel boosting level Vch-s or Vch-d (e.g., Vch-s/d) is also approximately constant when the increasing Vpass-s/d (waveform 1080 in FIG. 10F) is applied. This approach advantageously achieves an approximately constant channel boosting levels in different channels.

In the embodiment of FIG. 8A, waveform 1080 represents Vpass-s and waveform 1082 represents Vch-s and Vch-d. In the embodiment of FIG. 9A, waveform 1080 represents Vpass-d and waveform 1082 represents Vch-d.

Figure 10H:
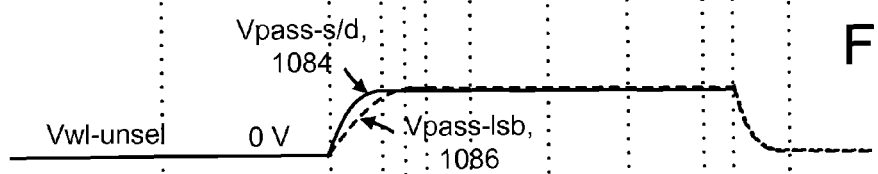
FIG. 10H depicts alternative voltages applied to unselected word lines during a program portion of a program-verify iteration, for the channel boosting techniques of FIGS. 8A, 9A or 10A.

FIG. 10H depicts alternative voltages applied to unselected word lines during a program portion of a program-verify iteration, e.g., for the channel boosting techniques of FIGS. 5A, 8A, 9A or 10A. This approach does not require increasing the unselected word line voltages during the program pulse time period. However, the above-mentioned advantages of better isolation between channel boosting regions can still be achieved. In this case, Vpass-s/d (waveform 1084) and Vpass-lsb (waveform 1086) are both approximately constant during the program pulse period, but the ramp up rate of Vpass-s/d is faster than the ramp up rate of Vpass-lsb.

Figure 10I:
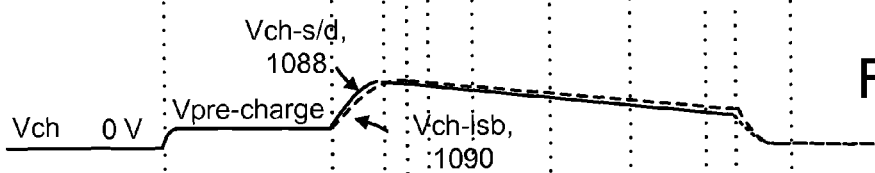
FIG. 10I depicts channel boosting levels in the substrate of the NAND string of FIGS. 8A, 9A or 10A e.g., based on the unselected word line voltages of FIG. 10H.

FIG. 10I depicts channel boosting levels in the substrate of the NAND string of FIGS. 8A, 9A or 10A e.g., based on the unselected word line voltages of FIG. 10H. Waveform 1090 indicates that the channel boosting level Vch-lsb decreases when Vpass-lsb (waveform 1086 in FIG. 10H) is applied. Waveform 1088 indicates that the channel boosting level Vch-s or Vch-d (e.g., Vch-s/d) also decreases when Vpass-s/d (waveform 1084 in FIG. 10H) is constant.

In the embodiment of FIG. 8A, waveform 1084 represents Vpass-s and waveform 1088 represents Vch-s and Vch-d. In the embodiment of FIG. 9A, waveform 1084 represents Vpass-d and waveform 1088 represents Vch-d.

Figure 11A:
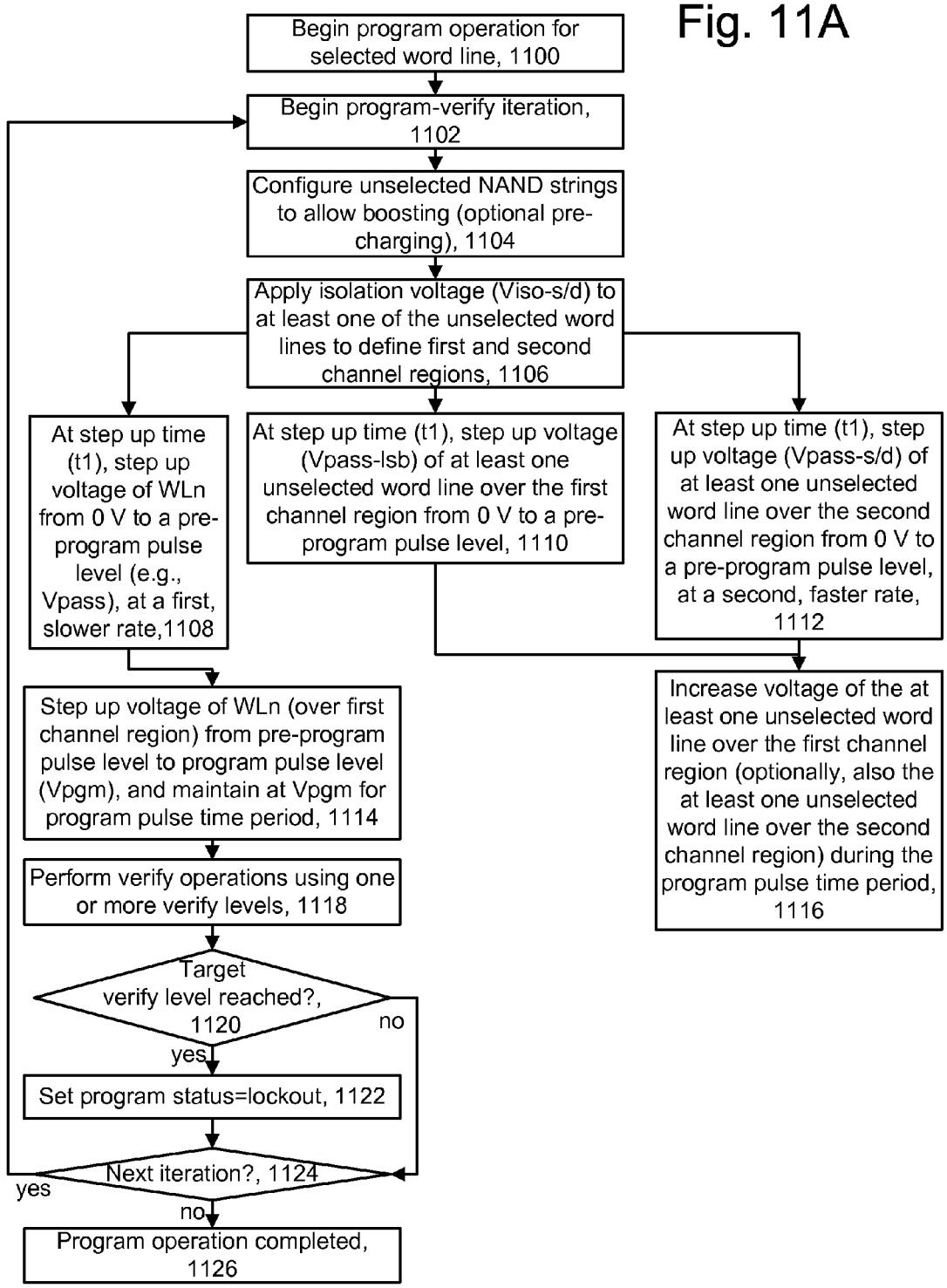
FIG. 11A depicts a programming method, e.g., based on the boosting technique of FIG. 8A or 9A.

FIG. 11A depicts a programming method, e.g., based on the boosting technique of FIG. 8A or 9A. Step 1100 begins a program operation for a selected word line. This operation could be one pass of a multiple pass operation, or the single pass of a programming operation, for instance. Step 1102 begins a program-verify iteration of the program operation. Step 1104 configures the unselected NAND strings to allow boosting. For example, this could involve setting Vsgd and Vbl to render the drain-side select gates non-conductive. Optionally, a pre-charge is passed to the channels of the unselected NAND strings, as discussed previously. Step 1106 applies an isolation voltage (Viso-s/d) to at least one of the unselected word lines to define first and second channel regions. An example in FIG. 8A is the first channel region 802 and the second channel region 800. An example in FIG. 9A is the first channel region 900 and the second channel region 902.

Step 1108, at the step up time (t1), steps up a voltage of WLn from 0 V (or other level) to a pre-program pulse level (e.g., Vpass) at a first, slower rate. Optionally, the voltage of WLn could be stepped up at a second, faster rate. Step 1110, at the step up time (t1), steps up a voltage (e.g., Vpass-lsb) of at least one unselected word line which extends directly over the first channel region from 0 V (or other level) to a pre-program pulse level. An example in FIG. 8A of the at least one unselected word line which extends directly over the first channel region includes the word lines associated with storage elements 533 to 536 and 538 to 551. An example in FIG. 9A of the at least one unselected word line which extends directly over the first channel region includes the word lines associated with storage elements 520 to 536 and 538 to 541.

Step 1112, at the step up time (t1), steps up a voltage (e.g. Vpass-s/d) of at least one unselected word line which extends directly over the second channel region from 0 V (or other level) to a pre-program pulse level (e.g., Vpass) at a second, faster rate. An example in FIG. 8A of the at least one unselected word line which extends directly over the second channel region includes the word lines associated with storage elements 520 to 529. An example in FIG. 9A of the at least one unselected word line which extends directly over the second channel region includes the word lines associated with storage elements 545 to 551.

Step 1114 steps up a voltage of WLn, which extends directly over the first channel region, from the pre-program pulse level of step 1108 to a program pulse level (Vpgm), and maintains at least Vpgm for a program pulse time period. Vpgm is a level which is sufficient to program a storage element. Typically, Vpgm is provided as a single pulse with a fixed amplitude, although it is possible to have varying amplitudes in a single program pulse. Vpgm can be a function of a loop number, or iteration number, of the program-verify iteration in a programming operation. Step 1116 increases the voltage of the at least one unselected word line which extends directly over the second channel region, during the program pulse time period.

Step 1118 performs verify operations using one or more verify levels, as part of the verify portion of the current program-verify iteration. Examples of verify levels include VvaL, VvbL and VvcL in FIGS. 3A and 3D, VvLM in FIG. 3B, and Vva, Vvb and Vvc in FIGS. 3C and 3E. At decision step 1120, if the target verify level has been reached for a selected storage element, then a program status is set to lockout for the storage element and its selected NAND string at step 1122. A NAND string having a lockout status becomes an inhibited or unselected NAND string in the next program-verify iteration.

If the target level is not reached for a selected storage element, then a decision step 1124 is reached. At decision step 1124, if an additional program-verify iteration is indicated (e.g., when all selected storage elements, or all less an allowable bit ignore number, have not yet been programmed and a maximum number of program-verify iterations have not yet been performed), a next program-verify iteration is started at step 1102. At decision step 1124, if an additional program-verify iteration is not indicated (e.g., all selected storage elements, or all, less an allowable bit ignore number, have been programmed or a maximum number of program-verify iterations have been performed), the program operation is completed, at step 1126.

Figure 11B:
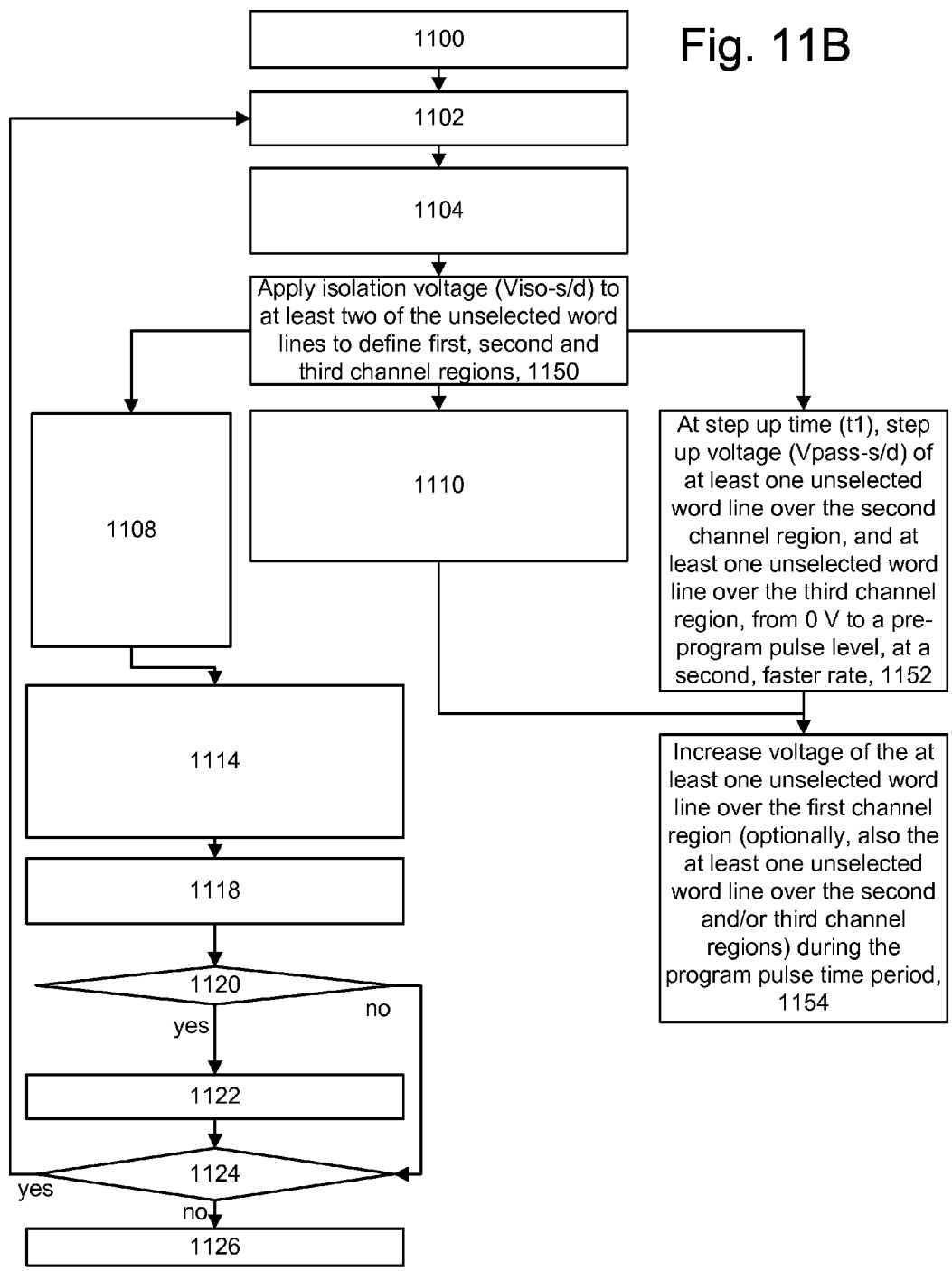
FIG. 11B depicts a programming method, e.g., based on the boosting technique of FIG. 10A.

FIG. 11B depicts a programming method, e.g., based on the boosting technique of FIG. 10A. Steps 1100, 1102, 1104, 1108, 1110, 1114, 1118, 1120, 1122, 1124 and 1126 are the same as in FIG. 11A. Step 1150 differs from step 1106 in that step 1150 applies an isolation voltage (e.g., Viso-s/d) to at least two of the unselected word lines to define first, second and third channel regions. An example in FIG. 10A includes the first, second and third channel regions 1002, 1004 and 1000, respectively. Step 1152, at the step up time (t1), steps up a voltage (e.g. Vpass-s/d) of at least one selected word line which extends directly over the second channel region, and at least one selected word line which extends directly over the third channel region, from 0 V (or other level) to a pre-program pulse level at a second, faster rate.

An example in FIG. 10A of the at least one unselected word line which extends directly over the second channel region includes the word lines associated with storage elements 545 to 551. An example in FIG. 10A of the at least one unselected word line which extends directly over the third channel region includes the word lines associated with storage elements 520 to 529.

Step 1154 increases the voltage of the at least one unselected word line which extends directly over the second channel region, and the at least one unselected word line which extends directly over the third channel region, during the program pulse time period.

Figure 11C:
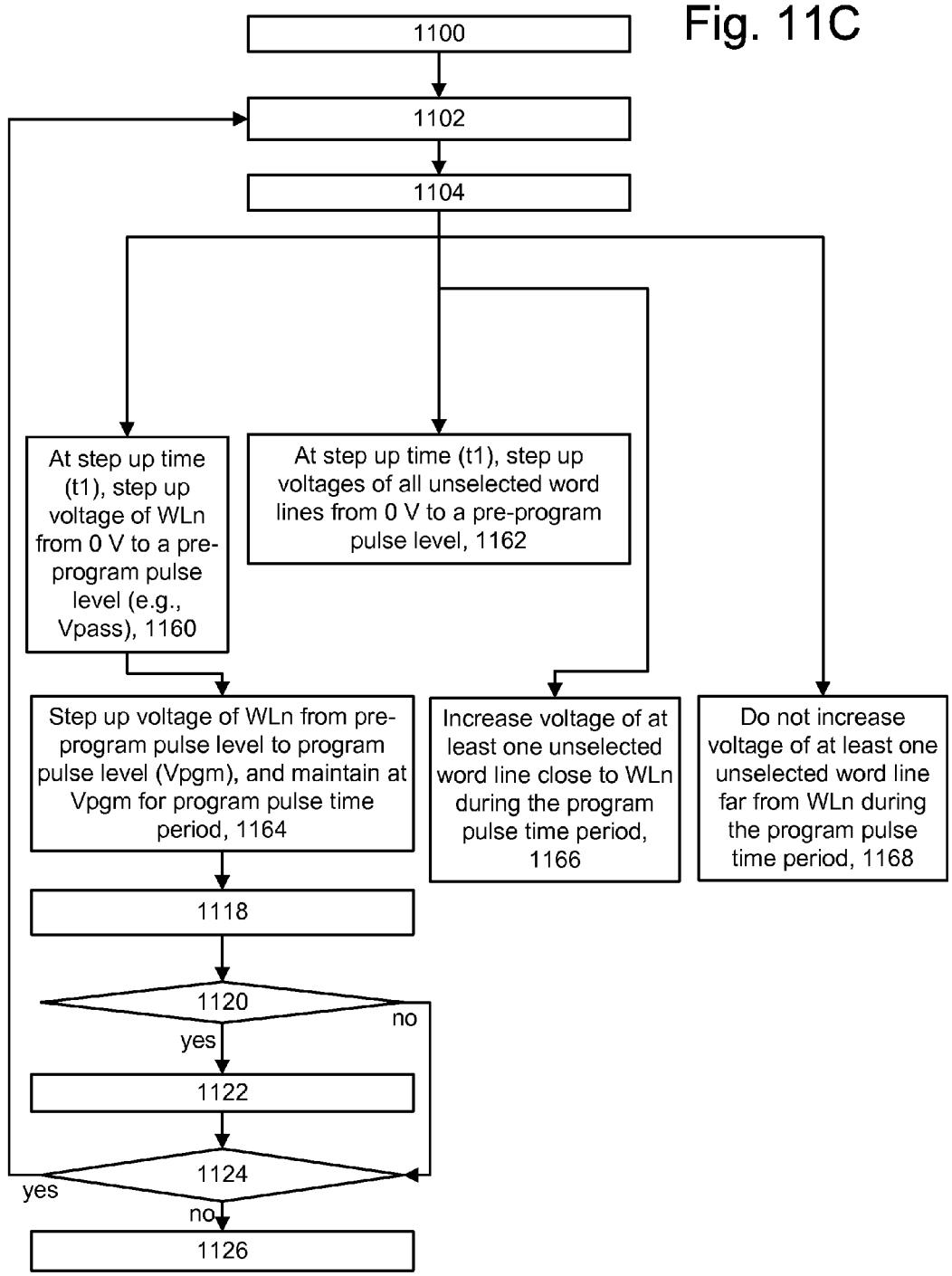
FIG. 11C depicts an additional programming method, e.g., based on the boosting technique of FIG. 5A.

FIG. 11C depicts an additional programming method, e.g., based on the boosting technique of FIG. 5A. This method can apply to any of the boosting techniques mentioned as well as other boosting techniques generally. This approach relates to increasing the pass voltage during the program pulse time period for unselected word lines which are close to the selected word line WLn, e.g., within a specified number of word lines away from WLn, such as 2-6 word lines, on either side of WLn, but not increasing the pass voltage during the program pulse time period for unselected word lines which are not close to the selected word line WLn, e.g., not within the specified number of word lines away from WLn. WLn−1 and WLn+1 could be treated the same as the other close unselected word lines, or differently than other close unselected word lines, if desired, such as by not increasing their voltage during the program pulse time period. As an example, voltage increases can be provided for the WLn−3 to WLn−1 and WLn+1 to WLn+3 but not for other word lines. See also FIG. 5B2. As another example, where WLn−1 and WLn+1 are treated differently, voltage increases can be provided for the WLn−3 and WLn−2 and WLn+2 and WLn+3, but not for other word lines.

Steps 1100, 1102, 1104, 1118, 1120, 1122, 1124 and 1126 are the same as in FIG. 11A. Step 1160, at the step up time t1, steps up the voltage of WLn from 0 V to a pre-program pulse level such as Vpass. Step 1162, at the step up time, steps up the voltage of all unselected word lines from 0 V to a pre-program pulse level such as Vpass. Step 1164 steps up the voltage of WLn from the pre-program pulse level to Vpgm and maintains Vpgm during the program pulse time period. Step 1166 increases the voltage of at least one unselected word line close to WLn during the program pulse time period. Step 1168 does not increase the voltage of at least one unselected word line which is not close to WLn during the program pulse time period. Optionally, step 1168 could increase the voltage of the at least one unselected word line which is not close to WLn, but to a lesser extent than the increase in step 1166 for the at least one unselected word line which is close to WLn.

FIG. 12A depicts a cross-sectional view of the selected NAND string 214 of FIG. 2A. Compared to the unselected NAND string previously discussed, the selected NAND string is end-to-end with NAND string portions 1202 and 1204, has a source-side select gate 1219 and a drain-side select gate 1252. Region 1206 represents a channel in the substrate 510 directly below the NAND string. Storage elements 1220-1251 extend in the NAND string.

FIG. 12B is a graph showing no channel boosting in the substrate of the selected NAND string of FIG. 12A. The x-axes of FIGS. 12A and 12B are aligned. In this example, the channel is not configured for boosting so no boosting occurs during the program pulse time period.

Accordingly, it can be seen that a non-volatile storage system is provided which includes a set of non-volatile storage elements formed in NAND strings on a substrate, including at least one NAND string (214) selected for programming in a program-verify iteration and at least one NAND string (212) unselected for programming in the program-verify iteration, the set of non-volatile storage elements is in communication with a plurality of word lines, including a word line (WLn) selected for programming in the program-verify iteration, and word lines (WL0 to WLn−1; WLn+1 to WLf) unselected for programming in the program-verify iteration. The non-volatile storage system further includes at least one control circuit (110, 150), the at least one control circuit, in connection with a program portion of the program-verify iteration: (a) configures the at least one unselected NAND string to allow boosting in at least one channel region of the substrate, below the at least one unselected NAND string, (b) steps up a voltage of the selected word line from a respective pre-program pulse voltage (Vpass) to a program pulse voltage (Vpgm) at a step up time (t4) which is before a program pulse time period (t5-t8), and maintains the program pulse voltage during the program pulse time period (t5-t8), and (c) to boost the at least one channel region, applies an increasing voltage (Vpass-lsb) to at least one of the unselected word lines (WLn−4 to WLn−1; WLn+1 to WLn+4).

In another embodiment, a method is provided for programming a non-volatile storage system in connection with a program portion of a program-verify iteration, the non-volatile storage system comprising a set of non-volatile storage elements formed in NAND strings on a substrate. The method includes: (a) selecting at least one NAND string (214) for programming in the program-verify iteration while at least one NAND string (212) is unselected for programming in the program-verify iteration, (b) selecting a word line (WLn) for programming in the program-verify iteration, the selected word line is among a plurality of word lines which are in communication with the NAND strings, while at least one unselected word line (WL0 to WLn−1; WLn+1 to WLf)) of the plurality of word lines is unselected for programming in the program-verify iteration, (c) configuring the at least one unselected NAND string to allow boosting in at least one channel region of the substrate, below the at least one unselected NAND string, (d) stepping up a voltage of the selected word line from a respective pre-program pulse voltage (Vpass) to a program pulse voltage (Vpgm), (e) maintaining the program pulse voltage during a program pulse time period (t5-t8); and (f) to boost the at least one channel region, apply an increasing voltage (Vpass-lsb) to at least one of the unselected word lines (WLn−4 to WLn−1; WLn+1 to WLn+4).

In another embodiment, a non-volatile storage system is provided which includes a set of non-volatile storage elements formed in NAND strings on a substrate, including at least one NAND string (214) selected for programming in the program-verify iteration and at least one NAND string (212) unselected for programming in the program-verify iteration, the set of non-volatile storage elements is in communication with a plurality of word lines, including a word line (WLn) selected for programming in the program-verify iteration, and word lines (WL0 to WLn−1; WLn+1 to WLf) unselected for programming in the program-verify iteration. The non-volatile storage system further includes at least one control circuit (110, 150).

The at least one control circuit, in connection with a program portion of the program-verify iteration: (a) configures the at least one unselected NAND string to allow boosting in the substrate below the at least one unselected NAND string, (b) applies an isolation voltage to at least one of the unselected word lines (WLn−6, WLn+6) to create at least first (Vch-lsb) and second (Vch-s/d) channel regions in the substrate below the at least one unselected NAND string, on either side of the at least one of the unselected word lines, the selected word line extending directly over the first channel region, and (c) at a step up time (t1) which is before a program pulse time period (t5-t8): (i) to boost the first channel region (Vch-lsb): steps up a voltage (Vpass-lsb) which is applied to at least one of the unselected word lines (WLn−4 to WLn−1; WLn+1 to WLn+4) which extends directly over the first channel region, to a respective pre-program pulse voltage (Vpass) of the at least one of the unselected word lines which extends directly over the first channel region, and (ii) to boost the second channel region (Vch-s/d): steps up a voltage (Vpass-s/d) which is applied to at least one of the unselected word lines (WL0 to WLn−8; WLn+8 to WLf) which extends directly over the second channel region, to a respective pre-program pulse voltage (Vpass) of the at least one of the unselected word lines which extends directly over the second channel region, at a faster rate than a rate at which the voltage (Vpass-lsb) applied to the at least one of the unselected word lines which extends directly over the first channel region.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A non-volatile storage system, comprising:
a set of non-volatile storage elements formed in NAND strings on a substrate, including at least one selected NAND string selected for programming in a program-verify iteration and at least one unselected NAND string unselected for programming in the program-verify iteration, the set of non-volatile storage elements is in communication with a plurality of word lines, including a selected word line selected for programming in the program-verify iteration, and unselected word lines unselected for programming in the program-verify iteration; and
at least one control circuit, the at least one control circuit, in connection with a program portion of the program-verify iteration: (a) configures the at least one unselected NAND string to allow boosting in at least one channel region in the substrate, below the at least one unselected NAND string, (b) steps up a voltage of the selected word line from a respective pre-program pulse voltage to a program pulse voltage at a step up time which is before a program pulse time period, and maintains the program pulse voltage during the program pulse time period, and (c) to boost the at least one channel region, during the program pulse time period: applies an increasing voltage to at least one of the unselected word lines, the increasing voltage applied to the at least one of the unselected word lines is increased at a rate which is a function of temperature.

2. The non-volatile storage system of claim 1, wherein:
the increasing voltage applied to the at least one of the unselected word lines is increased over a majority of the program pulse time period.

3. The non-volatile storage system of claim 1, wherein:
the increasing voltage applied to the at least one of the unselected word lines is increased at a relatively high rate when the temperature is relatively high, and at a relatively low rate when the temperature is relatively low.

4. The non-volatile storage system of claim 1, wherein:
the increasing voltage applied to the at least one of the unselected word lines is increased in a staircase waveform.

5. The non-volatile storage system of claim 1, wherein:
the increasing voltage applied to the at least one of the unselected word lines is increased by being ramped up.

6. The non-volatile storage system of claim 1, wherein:
the at least one control circuit, to configure the at least one unselected NAND string to allow boosting in the at least one channel region, renders a drain-side select gate of the at least one unselected NAND string non-conductive.

7. The non-volatile storage system of claim 1, wherein:
the increasing voltage applied to the at least one of the unselected word lines increases from an initial level, the initial level is tailored to a level of the program pulse voltage so that the initial level is higher when the program pulse voltage is higher.

8. The non-volatile storage system of claim 1, wherein:
the at least one control circuit, in connection with the program portion of the program-verify iteration: applies the increasing voltage to a plurality of unselected word lines which are within a specified number of word lines from the selected word line, on either side of the selected word line.

9. The non-volatile storage system of claim 8, wherein:
the at least one control circuit, in connection with the program portion of the program-verify iteration: does not apply the increasing voltage to a chosen number of unselected word lines which are not within the specified number of word lines from the selected word line, on either side of the selected word line.

10. The non-volatile storage system of claim 1, wherein:
the at least one control circuit, in connection with the program portion of the program-verify iteration: applies an isolation voltage to at least another one of the unselected word lines to define at least first channel region and a second channel region of the at least one channel region, on either side of the at least one of the unselected word lines, the selected word line extending directly over the first channel region; and
the at least one of the unselected word lines extends directly over the first channel region, so that the first channel region is boosted by the increasing voltage.

11. The non-volatile storage system of claim 10, wherein:
the at least one control circuit, in connection with the program portion of the program-verify iteration: applies an isolation voltage to at least an additional one of the unselected word lines to create a third channel region of the at least one channel region, the first channel region extends between the second and third channel regions.

12. The non-volatile storage system of claim 10, wherein during the program portion of the program-verify iteration, at another step up time, the at least one control circuit:
steps up the voltage which is applied to the at least one of the unselected word lines which extends directly over the first channel region to a respective pre-program pulse voltage of the at least one of the unselected word lines which extends directly over the first channel region; and
to boost the second channel region: steps up a voltage which is applied to at least one of the unselected word lines which extends directly over the second channel region, to a respective pre-program pulse voltage of the at least one of the unselected word lines which extends directly over the second channel region, at a faster rate than a rate at which the voltage applied to the at least one of the unselected word lines which extends directly over the first channel region is stepped up.

13. The non-volatile storage system of claim 12, wherein:
the voltage applied to the at least one of the unselected word lines which extends directly over the second channel region is non-decreasing during the program pulse time period.

14. The non-volatile storage system of claim 12, wherein:
the voltage applied to the at least one of the unselected word lines which extends directly over the second channel region increases during the program pulse time period.

15. The non-volatile storage system of claim 1, wherein:
the increasing voltage applied to the at least one of the unselected word lines increases from a respective pre-program pulse voltage which is greater than 0 V.

16. The non-volatile storage system of claim 15, wherein:
the respective pre-program pulse voltage of the at least one of the unselected word lines is equal to the pre-program pulse voltage of the selected word line.

17. The non-volatile storage system of claim 1, wherein:
the at least one control circuit, to boost the at least one channel region, during the program pulse time period: applies the increasing voltage to a plurality of the unselected word lines.

18. A method for programming a non-volatile storage system in connection with a program portion of a program-verify iteration, the non-volatile storage system comprising a set of non-volatile storage elements formed in NAND strings on a substrate, the method comprising:
selecting at least one NAND string for programming in the program-verify iteration while at least one unselected NAND string is unselected for programming in the program-verify iteration;
selecting a word line for programming in the program-verify iteration, the selected word line is among a plurality of word lines which are in communication with the NAND strings, while at least one unselected word line of the plurality of word lines is unselected for programming in the program-verify iteration;
configuring the at least one unselected NAND string to allow boosting in at least one channel region of the substrate, below the at least one unselected NAND string;
stepping up a voltage of the selected word line from a respective pre-program pulse voltage to a program pulse voltage;
maintaining the program pulse voltage during a program pulse time period; and
to boost the at least one channel region, during the program pulse time period: applying an increasing voltage to the at least one unselected word line, the voltage applied to the at least one unselected word line is increased at a rate which is a function of temperature.

19. The method of claim 18, wherein:
the increasing voltage applied to the at least one unselected word line is increased over a majority of the program pulse time period.

20. The method of claim 18, wherein:
the increasing voltage applied to the at least one unselected word line is increased at a relatively high rate when the temperature is relatively high, and at a relatively low rate when the temperature is relatively low.

21. The method of claim 18, wherein:
the increasing voltage applied to the at least one unselected word line is increased in a staircase waveform.

22. The method of claim 18, wherein:
the increasing voltage applied to the at least one unselected word line is increased by being ramped up.

* * * * *